United States Patent
Yu et al.

(10) Patent No.: US 11,527,908 B2
(45) Date of Patent: Dec. 13, 2022

(54) DEVICE FOR CONTROLLING WIRELESS CHARGING OUTPUT POWER BASED ON PWM INTEGRATING CIRCUIT

(71) Applicant: Chengdu Sprouting Technology Co., Ltd., Chengdu (CN)

(72) Inventors: Yiqiang Yu, Chengdu (CN); Pengfei Hu, Chengdu (CN); Jun Song, Chengdu (CN)

(73) Assignee: CHENGDU SPROUTING TECHNOLOGY CO., LTD., Chengdu (CN)

( * ) Notice: Subject to any disclaimer, the term of this patent is extended or adjusted under 35 U.S.C. 154(b) by 156 days.

(21) Appl. No.: 17/029,073

(22) Filed: Sep. 23, 2020

(65) Prior Publication Data
US 2021/0159719 A1    May 27, 2021

(30) Foreign Application Priority Data
Nov. 27, 2019 (CN) .......................... 201911185110.9

(51) Int. Cl.
*H02J 7/00* (2006.01)
*H02J 7/06* (2006.01)
(Continued)

(52) U.S. Cl.
CPC .............. *H02J 7/06* (2013.01); *H02J 7/0042* (2013.01); *H02J 50/12* (2016.02); *H02J 50/20* (2016.02);
(Continued)

(58) Field of Classification Search
USPC ........ 320/106, 107, 108, 109, 147, 148, 149
See application file for complete search history.

(56) References Cited

U.S. PATENT DOCUMENTS

2013/0249479 A1* 9/2013 Partovi ................... H02J 50/70
320/108
2014/0084858 A1* 3/2014 Kim ....................... H02J 7/0029
320/108
(Continued)

FOREIGN PATENT DOCUMENTS

CN    110062996 A  *  7/2019   ............. B60L 53/12
KR    20140093348 A  *  7/2014

*Primary Examiner* — Brian Ngo
(74) *Attorney, Agent, or Firm* — Bayramoglu Law Offices LLC

(57) ABSTRACT

A device for controlling wireless charging output power based on a PWM integrating circuit includes a magnetic-resonance transmitting module and a magnetic-resonance receiving module. The magnetic-resonance transmitting module includes a wireless charging base, a Bluetooth master circuit, a DC/DC regulator circuit, a PWM integrating circuit, a radio-frequency power amplifier source, a radio-frequency current sampling circuit and a magnetic-resonance transmitting antenna. Both the radio-frequency power amplifier source and the magnetic-resonance transmitting antenna are mounted at the wireless charging base. The magnetic-resonance transmitting antenna is connected to the magnetic-resonance receiving module. The magnetic-resonance receiving module includes a cooling fin, a magnetic-resonance receiving antenna, a Bluetooth slave circuit, a receiving rectifier and regulator circuit and a charging control circuit. The magnetic-resonance receiving antenna, the receiving rectifier and regulator circuit and the charging control circuit are connected successively. The magnetic-resonance receiving antenna is arranged directly above the magnetic-resonance transmitting antenna.

9 Claims, 13 Drawing Sheets

(51) Int. Cl.
*H02J 50/12* (2016.01)
*H02J 50/20* (2016.01)
*H03F 3/20* (2006.01)

(52) U.S. Cl.
CPC .............. *H03F 3/20* (2013.01); *H02J 7/0047* (2013.01); *H02J 7/00304* (2020.01); *H02J 7/00711* (2020.01); *H02J 2207/20* (2020.01); *H03F 2200/222* (2013.01); *H03F 2200/387* (2013.01); *H03F 2200/451* (2013.01)

(56) References Cited

U.S. PATENT DOCUMENTS

| | | | | |
|---|---|---|---|---|
| 2015/0327839 | A1* | 11/2015 | Kim | A61B 8/56 600/447 |
| 2017/0129344 | A1* | 5/2017 | Islinger | H02J 7/04 |
| 2018/0159371 | A1* | 6/2018 | Kim | H02J 7/00034 |

* cited by examiner

DEVICE FOR CONTROLLING WIRELESS CHARGING OUTPUT POWER BASED ON PWM INTEGRATING CIRCUIT

CROSS REFERENCE TO THE RELATED APPLICATIONS

This application is based upon and claims priority to Chinese Patent Application No. 201911185110.9, filed on Nov. 27, 2019, the entire contents of which are incorporated herein by reference.

TECHNICAL FIELD

The present invention belongs to the technical field of wireless power transmission, and more particularly relates to a device for controlling wireless charging output power based on a pulse width modulation (PWM) integrating circuit.

BACKGROUND

Various household appliances, consumer electronic products and mobile communication apparatus have been widely popularized in proportion to the continuous development of electronic information and automation control technologies. Both traditional household appliances and electronic apparatus with built-in batteries are powered through a wired connection between a power line and a power socket. Electric utility lines and wires for supplying power to these electronic apparatus are ubiquitous. Such lines and wires not only occupy an activity space and limit the convenient use of the devices and apparatus, but also present dangers with respect to electrical safety, some of which are hidden. Thus, with increased demand for a wireless-based portable device and a green energy system, research and application of a wireless energy transmission technology has rapidly become a focus in academic and industrial circles at China and throughout the world.

Currently, the wireless energy transmission technology is being gradually applied to low-power electronic products in people's daily lives, and replaces the original power line to charge the apparatus wirelessly, making lives more convenient. For example, a wireless charging toothbrush and a wireless charging blanket are charged based on a magnetic induction coupling technology. Moreover, the wireless energy transmission technology has a much greater application value and a much greater market potential. For example, the application of the wireless energy transmission technology in the field of smart homes will change a usage mode of traditional household appliances, mobile communication devices and consumer electronics. Considering a residential building structure as a platform, all the power lines in a domestic living area can be completely removed by using a medium-distance wireless energy transmission technology, a concealed wiring technology and an automatic control technology. At the same time, apparatus are charged or powered continuously without wire connection, thereby improving a home's safety, residential convenience, comfort and aesthetics. A high-efficiency, environment-friendly and energy-saving living environment is achieved. In addition, the same wireless energy transmission technology is important in the context of biomedical research and apparatus and medical diagnosis and treatment.

SUMMARY

To overcome the above-mentioned shortcomings in the prior art, the present invention provides a device for controlling wireless charging output power based on a PWM integrating circuit. The invention solves the problem of insufficient transmission efficiency of current magnetic induction technology and provides the functionality for dynamically adjusting the power in the wireless charging process using magnetic resonance technology.

To achieve the above object, the present invention adopts the following technical solution.

A device for controlling wireless charging output power based on a PWM integrating circuit includes a magnetic-resonance transmitting module and a magnetic-resonance receiving module connected to the magnetic-resonance transmitting module.

The magnetic-resonance transmitting module includes a wireless charging base, a Bluetooth master circuit, a direct current/direct current (DC/DC) regulator circuit, the PWM integrating circuit, a radio-frequency power amplifier source, a radio-frequency current sampling circuit and a magnetic-resonance transmitting antenna. The DC/DC regulator circuit, the PWM integrating circuit, the radio-frequency power amplifier source, the radio-frequency current sampling circuit and the magnetic-resonance transmitting antenna are connected to the Bluetooth master circuit, respectively. Both the radio-frequency power amplifier source and the magnetic-resonance transmitting antenna are mounted at the wireless charging base. The magnetic-resonance transmitting antenna is connected to the magnetic-resonance receiving module.

The magnetic-resonance receiving module includes a cooling fin, a magnetic-resonance receiving antenna, a Bluetooth slave circuit, a receiving rectifier and regulator circuit and a charging control circuit. The receiving rectifier and regulator circuit and a charging control circuit are connected to the Bluetooth slave circuit, respectively. The magnetic-resonance receiving antenna, the receiving rectifier and regulator circuit and the charging control circuit are connected successively. Both the receiving rectifier and regulator circuit and the Bluetooth slave circuit are fixed at the upper surface of the cooling fin. The magnetic-resonance receiving antenna is arranged directly above the magnetic-resonance transmitting antenna.

The present invention has the following advantages. In the present invention, the lithium battery is directly charged by the magnetic-resonance wireless charging technology. Electromagnetic energy is transmitted by the magnetic-resonance transmitting antenna and is transferred to the receiving rectifier and regulator circuit by the magnetic-resonance receiving antenna, so as to supply power to the charging control circuit. Then, the charging control circuit supplies power to the lithium battery. In this process, the Bluetooth slave circuit monitors a voltage and a current which are required to be consumed by the charging control circuit, and transmits the information to the magnetic-resonance transmitting module through Bluetooth. After receiving the voltage and the current, which are required by the charging process, the Bluetooth master circuit of the magnetic-resonance transmitting module adjusts a PWM input duty ratio of the PWM integrating circuit, and then adjusts an output voltage of the DC/DC regulator circuit, thereby adjusting transmitted power of an output end. With the above design, the present invention solves the problem that an efficiency of a wireless charging transmitting end cannot be effectively utilized because the output power of the wireless charging transmitting end cannot be dynamically adjusted when load power of a receiving end varies. In this way, the power of the wireless charging transmitting end is adjusted according to the power required by the wireless charging receiving end in real time, which guarantees efficient operation of the wireless charging system.

In the figures: 1—magnetic-resonance transmitting module, 2—magnetic-resonance receiving module, 3—Bluetooth master circuit, 4—DC/DC regulator circuit, 5—PWM integrating circuit, 6—radio-frequency power amplifier source, 7—radio-frequency current sampling circuit, 8—magnetic-resonance transmitting antenna, 9—Bluetooth slave circuit, 10—charging control circuit, 11—receiving rectifier and regulator circuit, 12—magnetic-resonance receiving antenna, 801—first transmitting resonance coil, 802—second transmitting resonance coil, 803—first connection point, 804—second connection point, 1201—receiving resonance coil, 1202—microstrip line, 1203—pad, 1204—third connection point, 1205—fourth connection point.

DETAILED DESCRIPTION OF THE EMBODIMENTS

Embodiments of the present invention are described hereinafter to facilitate understanding of the present invention by those skilled in the art, but it should be understood that the present invention is not limited to the scope of the embodiments, and it should be recognized by those skilled in the art that various changes may be made without departing from the spirit and scope of the present invention as defined and determined by the appended claims, and any invention utilizing the inventive concept of the present invention shall fall within the scope of protection of the present invention.

EMBODIMENT

Figure 1:
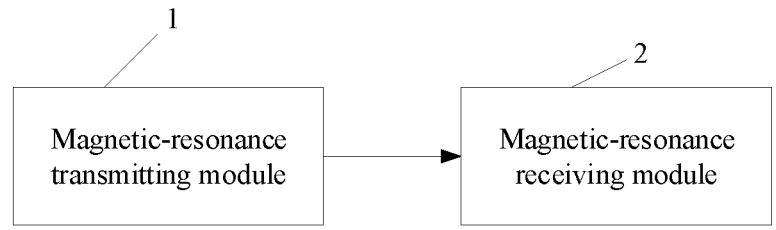
FIG. 1 is a schematic diagram showing the structure of the present invention.
Figure 2:
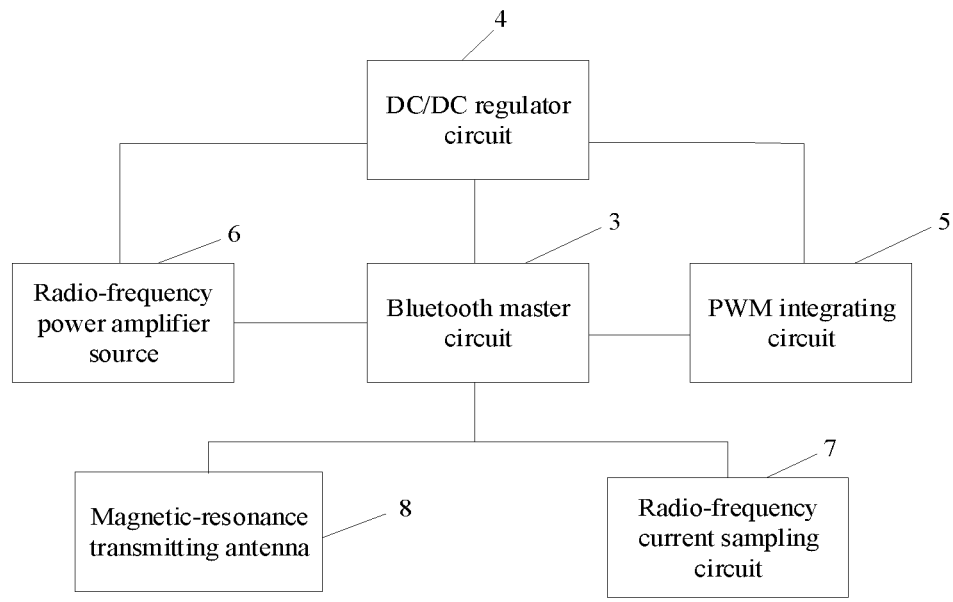
FIG. 2 is a schematic diagram showing the structure of a magnetic-resonance transmitting module according to the present invention.
Figure 3:
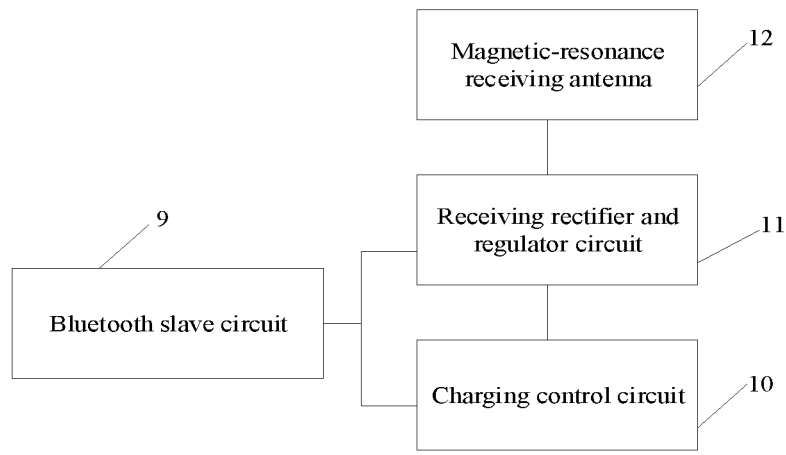
FIG. 3 is a schematic diagram showing the structure of a magnetic-resonance receiving module according to the present invention.

An embodiment of the present invention provides a device for controlling wireless charging output power based on a PWM integrating circuit, and a magnetic-resonance transmitting module directly supplies power to a magnetic-resonance receiving module by using a magnetic-resonance wireless charging technology, so as to charge an apparatus. As shown in FIG. 1, the device includes the magnetic-resonance transmitting module 1, and the magnetic-resonance receiving module 2 connected to the magnetic-resonance transmitting module 1. As shown in FIG. 2, the magnetic-resonance transmitting module 1 includes a wireless charging base, the Bluetooth master circuit 3, the DC/DC regulator circuit 4, the PWM integrating circuit 5, the radio-frequency power amplifier source 6, the radio-frequency current sampling circuit 7 and the magnetic-resonance transmitting antenna 8. The DC/DC regulator circuit 4, the PWM integrating circuit 5, the radio-frequency power amplifier source 6, the radio-frequency current sampling circuit 7 and the magnetic-resonance transmitting antenna 8 are connected to the Bluetooth master circuit 3, respectively. Both the radio-frequency power amplifier source 6 and the magnetic-resonance transmitting antenna 8 are mounted at the wireless charging base. The magnetic-resonance transmitting antenna 8 is connected to the magnetic-resonance receiving module 2. As shown in FIG. 3, the magnetic-resonance receiving module 2 includes a cooling fin, the magnetic-resonance receiving antenna 12, the Bluetooth slave circuit 9, the receiving rectifier and regulator circuit 11 and the charging control circuit 10. The receiving rectifier and regulator circuit 11 and the charging control circuit 10 are connected to the Bluetooth slave circuit 9, respectively. The magnetic-resonance receiving antenna 12, the receiving rectifier and regulator circuit 11 and the charging control circuit 10 are connected successively. Both the receiving rectifier and regulator circuit 11 and the Bluetooth slave circuit 9 are fixed at the upper surface of the cooling fin. The magnetic-resonance receiving antenna 12 is arranged directly above the magnetic-resonance transmitting antenna 8.

In the present embodiment, the magnetic-resonance transmitting module 1 is configured to emit magnetic-resonance radio energy. The magnetic-resonance receiving module 2 is configured to directly supply power to a magnetic-induction transmitting module. The magnetic-resonance receiving module 2 further includes a lithium battery and a battery management circuit which are arranged above the magnetic-resonance receiving antenna 12. A ferrite magnet separator is arranged between the lithium battery and the magnetic-resonance receiving antenna 12. The lithium battery is connected to the charging control circuit 10 and the battery management circuit, respectively. In the present invention, the lithium battery is directly charged by the magnetic-resonance wireless charging technology. Electromagnetic energy is transmitted by the magnetic-resonance transmitting antenna 8 and is transferred to the receiving rectifier and regulator circuit 11 by the magnetic-resonance receiving antenna 12, so as to supply power to the charging control circuit 10, and then the charging control circuit 10 supplies power to the lithium battery. In this process, the Bluetooth slave circuit 9 monitors a voltage and a current which are required to be consumed by the charging control circuit 10, and transmits the information to the magnetic-resonance transmitting module 1 through Bluetooth. After receiving the voltage and the current that are required by the charging process, the Bluetooth master circuit 3 of the magnetic-resonance transmitting module 1 adjusts a PWM input duty ratio of the PWM integrating circuit 5, and then adjusts an output voltage of the DC/DC regulator circuit 4, thereby adjusting transmitted power of an output end. With the above design, the present invention solves the problem that an efficiency of a wireless charging transmitting end cannot be effectively utilized because the output power of the wireless charging transmitting end cannot be dynamically adjusted when load power of a receiving end varies. In this way, the power of the wireless charging transmitting end is adjusted according to the power required by the wireless charging receiving end in real time, which guarantees efficient operation of the wireless charging system.

Figure 4A:
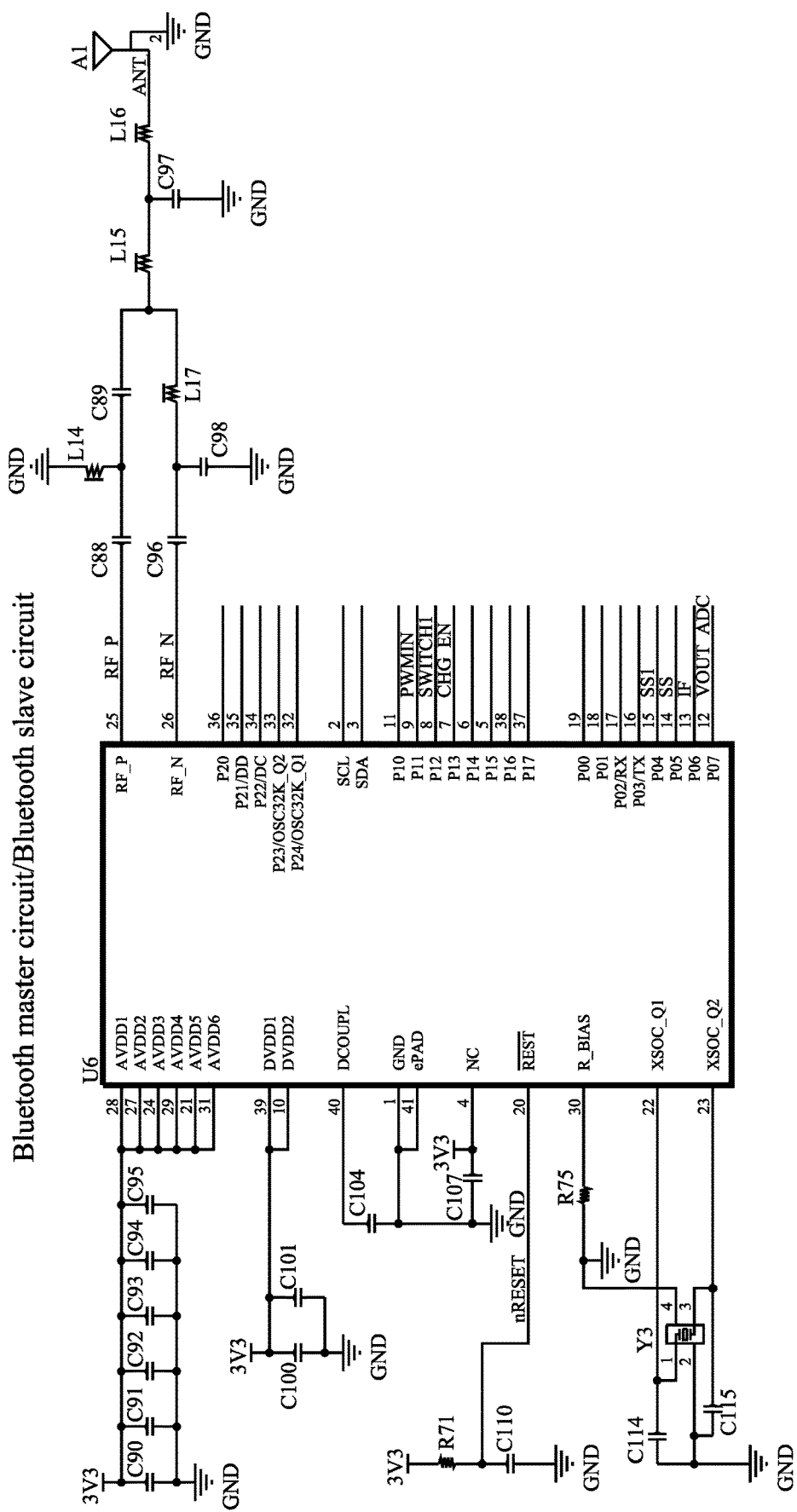
FIGS. 4(a)-4(c) show a circuit diagram of a Bluetooth master circuit or a Bluetooth slave circuit according to the present invention.
Figure 4B:
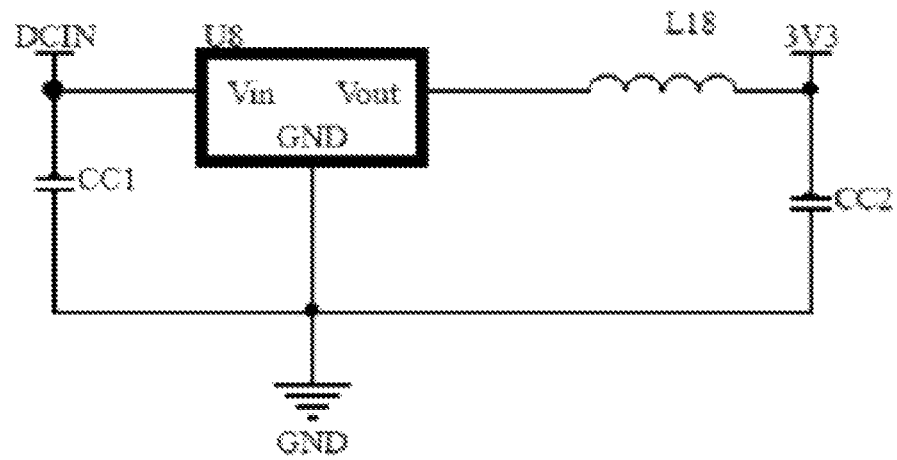
Figure 4C:
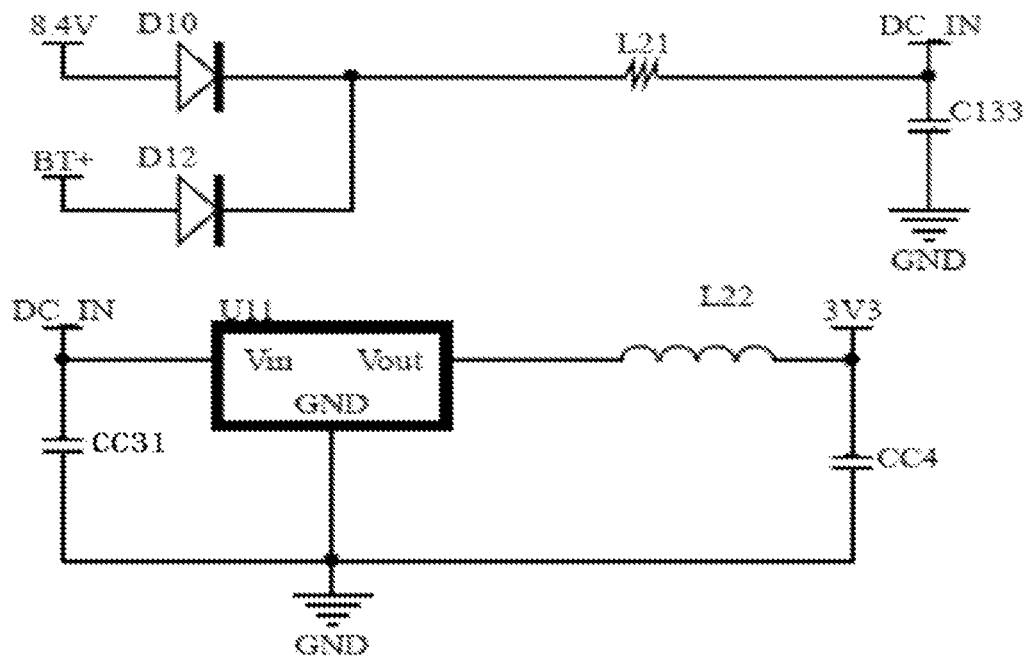

As shown in FIGS. 4(a)-4(c), the Bluetooth master circuit 3 and the Bluetooth slave circuit 9 have the same structure, and each of the Bluetooth master circuit 3 and the Bluetooth slave circuit 9 includes the Bluetooth chip U6. The Bluetooth master circuit further includes a first low dropout (LDO) sub-circuit, and the first LDO sub-circuit includes the regulator chip U8. The Bluetooth slave circuit further includes a second LDO sub-circuit, and the second LDO sub-circuit includes the regulator chip U11.

As shown in FIG. 4 (a), the pin AVDD1 of the chip U6 is connected to the pin AVDD2 of the chip U6, the pin AVDD3 of the chip U6, the pin AVDD4 of the chip U6, the pin AVDD5 of the chip U6, the pin AVDD6 of the chip U6, the pin DVDD1 of the chip U6, the pin NC of the chip U6, the grounded capacitor C95, the grounded capacitor C94, the grounded capacitor C93, the grounded capacitor C92, the grounded capacitor C91, the grounded capacitor C90, one end of the resistor R71, the chip U11 and the chip U8, respectively. The pin DVDD1 of the chip U6 is further connected to the pin DVDD2 of the chip U6, one end of the capacitor C101 and one end of the capacitor C100, respectively. The other end of the capacitor C101 is connected to the other end of the capacitor C100 and is grounded. The pin DCOUPL of the chip U6 is connected to one end of the capacitor C104. The other end of the capacitor C104 is connected to one end of the capacitor C107, the pin GND of the chip U6 and the pin ePAD of the chip U6, respectively, and is grounded. The other end of the capacitor C107 is connected to the pin NC of the chip U6. The pin REST of the chip U6 is connected to the grounded capacitor C110 and the other end of the resistor R71, respectively. The pin R_BIAS of the chip U6 is connected to one end of the resistor R75. The other end of the resistor R75 is connected to the 4$^{th}$ pin of the crystal oscillator Y3 and is grounded. The pin XSOC_Q1 of the chip U6 is connected to the 1$^{st}$ pin of the crystal oscillator Y3 and one end of the capacitor C114, respectively. The pin XSOC_Q2 of the chip U6 is connected to one end of the capacitor C115 and the 3$^{rd}$ pin of the crystal oscillator Y3, respectively. The other end of the capacitor C115 is connected to the 2$^{nd}$ pin of the crystal oscillator Y3 and the other end of the capacitor C114, respectively, and is grounded. The pin RF_P of the chip U6 is connected to one end of the capacitor C88. The other end of the capacitor C88 is connected to one end of the capacitor C89 and one end of the inductor L14, respectively. The other end of the inductor L14 is grounded. The other end of the capacitor C89 is connected to one end of the inductor L17 and one end of the inductor L15, respectively. The other end of the inductor L17 is connected to one end of the capacitor C96 and the grounded capacitor C98, respectively. The other end of the capacitor C96 is connected to the pin RF_N of the chip U6. The other end of the inductor L15 is connected to the grounded capacitor C97 and one end of the inductor L16, respectively. The other end of the inductor L16 is connected to one end of the magnetic-resonance transmitting antenna 8, and the other end of the magnetic-resonance transmitting antenna 8 is grounded. The pin P11 of the chip U6 is connected to the PWM integrating circuit 5. The pin P06 of the chip U6 and the pin P12 of the chip U6 are connected to the DC/DC regulator circuit 4. The pin P06 of the chip U6 is connected to the charging control circuit 10 and the radio-frequency current sampling circuit 7, respectively. The pin P07 of the chip U6 is connected to the DC/DC regulator circuit 4. The pin P13 of the chip U6, the pin P04 of the chip U6, the pin P05 of the chip U6 are connected to the charging control circuit 10, respectively.

As shown in FIG. 4(b), the end Vin of the chip U8 is connected to one end of the capacitor CC1, the radio-frequency power amplifier source 6 and the DC/DC regulator circuit 4, respectively. The end Vout of the chip U8 is connected to one end of the inductor L18. The other end of the inductor L18 is connected to the pin AVDD1 of the chip U6 and one end of the capacitor CC2, respectively. The grounded end GND of the chip U8 is connected to the other end of the capacitor CC1 and the other end of the capacitor CC2, respectively, and is grounded.

As shown in FIG. 4(c), the pin Vin of the chip U11 is connected to one end of the capacitor CC31, the grounded capacitor C133 and one end of the inductor L21, respectively. The other end of the inductor L21 is connected to the cathode of the diode D10 and the cathode of the diode D12, respectively. The anode of the diode D10 is connected to the receiving rectifier and regulator circuit 11 and the charging control circuit 10, respectively. The anode of the diode D12 is connected to the anode of the lithium battery. The pin Vout of the chip U11 is connected to one end of the inductor L22. The other end of the inductor L22 is connected to the pin AVDD1 of the chip U6 and one end of the capacitor CC4, respectively. The other end of the capacitor CC4 is connected to the pin GND of the chip U11 and the other end of the capacitor CC31, respectively, and is grounded. In the present invention, when the Bluetooth master circuit and the Bluetooth slave circuit directly supply power to the magnetic-resonance receiving module by using the magnetic-resonance wireless charging technology to further charge the apparatus, the charging process of the magnetic-resonance receiving module is controlled. The Bluetooth master circuit dynamically adjusts the input duty ratio of the PWM circuit by monitoring the charging current and voltage of the magnetic-resonance receiving module in real time, thereby adjusting the output voltage of the magnetic-resonance transmitting module to dynamically match the output power with the received power.

Figure 5:
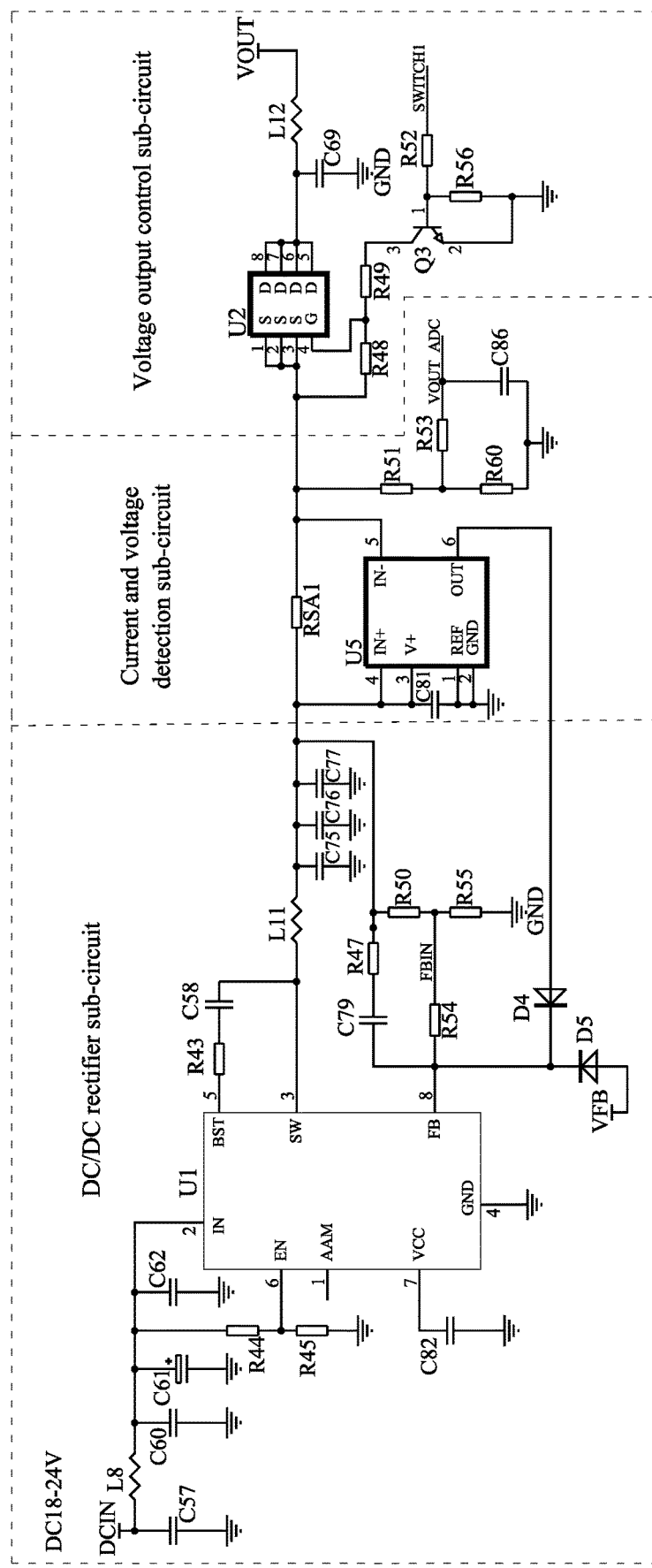
FIG. 5 is a circuit diagram of a DC/DC regulator circuit according to the present invention.

As shown in FIG. 5, the DC/DC regulator circuit 4 includes a DC/DC rectifier sub-circuit, a current and voltage detection sub-circuit, and a voltage output control sub-circuit.

The DC/DC rectifier sub-circuit includes the rectifier chip U1. The pin IN of the chip U1 is connected to the grounded capacitor C62, one end of the resistor R44, the anode of the polar capacitor C61, the grounded capacitor C60 and one end of the inductor L8, respectively. The other end of the inductor L8 is connected to the end Vin of the chip U8 and the grounded capacitor C57, respectively. The cathode of the polar capacitor C61 is grounded. The pin EN of the chip U1 is connected to the other end of the resistor R44 and the grounded resistor R45, respectively. The pin VCC of the chip U1 is connected to the grounded capacitor C82. The pin GND of the chip U1 is grounded. The pin FB of the chip U1 is connected to one end of the capacitor C79, one end of the resistor R54, the cathode of the diode D4, and the cathode of the diode D5, respectively. The anode of the diode D5 is connected to the PWM integrating circuit 5, and the anode of the diode D4 is connected to the current and voltage detection sub-circuit. The other end of the capacitor C79 is connected to one end of the resistor R47. The other end of the resistor R47 is connected to one end of the resistor R50, the current and voltage detection sub-circuit, the grounded capacitor C77, the grounded capacitor C76, the grounded capacitor C75 and one end of the inductor L11, respectively. The other end of the resistor R50 is connected to the other end of the resistor R54 and the grounded resistor R55, respectively. The pin SW of the chip U1 is connected to one end of the capacitor C58 and the other end of the inductor L11, respectively. The other end of the capacitor C58 is connected to one end of the resistor R43. The other end of the resistor R43 is connected to the pin RST of the chip U1.

The current and voltage detection sub-circuit includes the detection chip U5. The pin IN+ of the chip U5 is connected to the pin V+ of the chip U5, the other end of the resistor R47, one end of the capacitor C81 and one end of the sampling resistor RSA1, respectively. The pin REF of the chip U5 is connected to the other end of the capacitor C81 and the pin GND of the chip U5, respectively, and is grounded. The pin OUT of the chip U5 is connected to the anode of the diode D4. The pin IN– of the chip U5 is connected to the other end of the sampling resistor RSA1, one end of the resistor R51 and the voltage output control sub-circuit, respectively. The other end of the resistor R51 is connected to one end of the resistor R53 and one end of the resistor R60, respectively. The other end of the resistor R53 is connected to the pin P07 of the chip U6 and one end of the capacitor C86, respectively. The other end of the resistor R60 is connected to the other end of the capacitor C86, and is grounded.

The voltage output control sub-circuit includes a P-channel metal oxide semiconductor (PMOS) transistor U2. The source of the PMOS transistor U2 is connected to the pin IN– of the chip U5 and one end of the resistor R48, respectively. The gate of the PMOS transistor U2 is connected to the other end of the resistor R48 and one end of the resistor R49, respectively. The other end of the resistor R49 is connected to the collector of the triode Q3. The emitter of the triode Q3 is connected to one end of the resistor R56 and is grounded. The base of the triode Q3 is connected to one end of the resistor R52 and the other end of the resistor R56, respectively. The other end of the resistor R52 is connected to the pin P12 of the chip U6. The drain of the PMOS transistor U2 is connected to the grounded capacitor C69 and one end of the inductor L12, respectively. The other end of the inductor L12 is connected to the radio-frequency power amplifier source 6.

In the present embodiment, in the DC/DC regulator circuit 4, a model of the chip U1 is MP2315, a model of the chip U5 is INA213A, and a model of the chip U2 is CEM4435A. The chip U5 detects a current consumed by the radio-frequency power amplifier source 6 by a voltage across the sampling resistor RSA1, and when the current exceeds a set threshold value, an output pin of the chip U5 outputs a high level, which results in a sudden increase of a voltage at the feedback pin FB of the chip U1, so that a voltage output by the regulator circuit falls below a normal working voltage to protect the following radio-frequency power amplifier source. When the current of the radio-frequency power amplifier source 6 returns to be lower than the normal value, the output level of the chip U5 maintains at a low level, the voltage at the pin FB of the chip U1 returns to normal, and the voltage output by the regulator circuit returns to a normal set value. In the present embodiment, the output voltage is divided by a voltage division circuit constructed by the resistor R51 and the resistor R60 to be fed into the AD sampling port of a chip of the Bluetooth master circuit The chip of the Bluetooth master circuit may monitor the output voltage of the regulator circuit in real time. By monitoring the output voltage of the regulator circuit, power supply of the radio-frequency power amplifier source may be effectively guaranteed by a power switching circuit constructed by the chip U2, so as to guarantee safe operation of the system.

Figure 6:
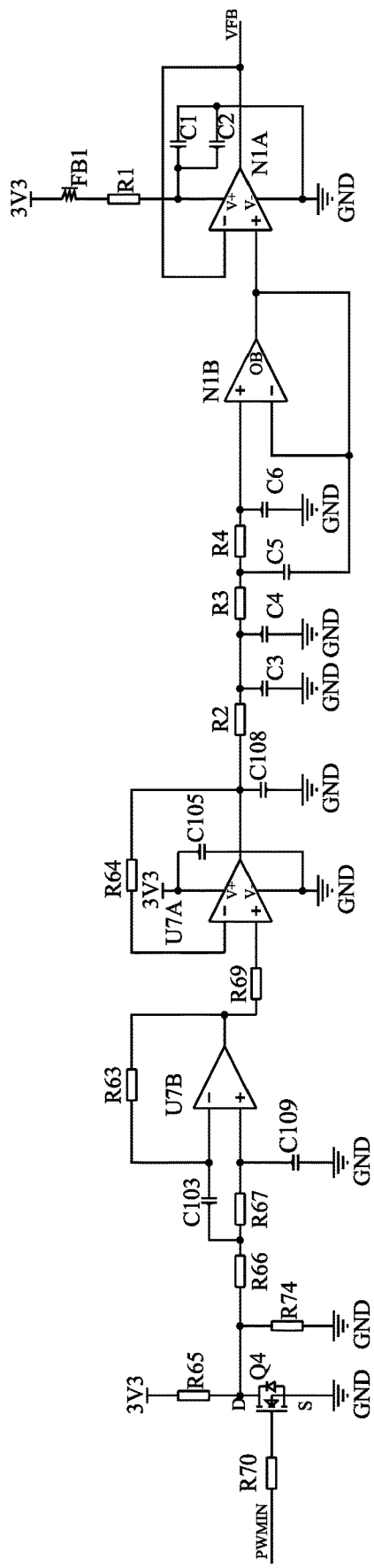
FIG. 6 is a circuit diagram of a PWM integrating circuit according to the present invention.

As shown in FIG. 6, the PWM integrating circuit 5 includes the operational amplifier chip U7A, the operational amplifier chip U7B, the operational amplifier chip N1A, the operational amplifier chip N1B and the N-channel metal oxide semiconductor (NMOS) transistor Q4. The gate of the NMOS transistor Q4 is connected to one end of the resistor R70, and the other end of the resistor R70 is connected to the pin P11 of the chip U6. The source of the NMOS transistor Q4 is grounded. The drain of the NMOS transistor Q4 is connected to one end of the resistor R65, the grounded resistor R74 and one end of the resistor R66, respectively. The other end of the resistor R65 is connected to the pin AVDD1 of the chip U6. The other end of the resistor R66 is connected to one end of the resistor R67 and one end of the capacitor C103, respectively. The other end of the resistor R67 is connected to the grounded capacitor C109 and the non-inverting input end of the chip U7B, respectively. The other end of the capacitor C103 is connected to one end of the resistor R63 and the inverting input end of the chip U7B, respectively. The other end of the resistor R63 is connected to one end of the resistor R69 and the output end OB of the chip U7B, respectively. The other end of the resistor R69 is connected to the non-inverting input end of the chip U7A. The inverting input end of the chip U7A is connected to one end of the resistor R64. The output end of the chip U7A is connected to the other end of the resistor R64, the grounded capacitor C108 and one end of the resistor R2, respectively. The pin V– of the chip U7A is connected to one end of a capacitor C105 and is grounded. The pin V+ of the chip U7A is connected to the pin AVDD1 of the chip U6 and the other end of the capacitor C105, respectively. The other end of the resistor R2 is connected to the grounded capacitor C3, the grounded capacitor C4 and one end of the resistor R3, respectively. The other end of the resistor R3 is connected to one end of the capacitor C5 and one end of the resistor R4, respectively. The other end of the resistor R4 is connected to the grounded capacitor C6 and the non-inverting input end of the chip N1B, respectively. The inverting input end of the chip N1B is connected to the other end of the capacitor C5, the output end OB of the chip N1B and the non-inverting input end of the chip N1A, respectively. The inverting input end of the chip N1A is connected to the output end of the chip N1A and the anode of the diode D5, respectively. The pin V– of the chip N1A is connected to one end of the capacitor C1 and one end of the capacitor C2, respectively, and is grounded. The pin V+ of the chip N1A is connected to one end of the resistor R1, the other end of the capacitor C2 and the other end of the capacitor C1, respectively. The other end of the resistor R1 is connected to one end of the inductor FB1, and the other end of the inductor FB1 is connected to the pin AVDD1 of the chip U6.

In the present invention, the Bluetooth master circuit analyzes the charging current and voltage fed back from the Bluetooth slave circuit, adjusts the PWM input duty ratio of the PWM integrating circuit as needed, changes the voltage output by the integrating circuit, and correspondingly adjusts the voltage of the pin FB of the DC/DC regulator circuit, thereby changing the output voltage of the DC/DC regulator circuit, dynamically adjusting the wireless charging output power and ensuring high wireless charging efficiency. A PWM signal with an adjustable duty ratio output by the Bluetooth circuits enters a following circuit after passing through the integrating circuit. A ripple signal generated by the integrating circuit is then filtered out through a three-order low-pass filter circuit constructed by the N1A and the N1B, and finally, an obtained signal enters an FB input network of the DC/DC circuit through the following circuit. In this way, the three-order low-pass filter circuit guarantees the stability of a DC voltage signal output by the PWM integrating circuit, reduces an influence of a DC level output by the PWM integrating circuit on a ripple of a DC/DC feedback circuit, and guarantees the stability of the DC/DC adjustable output voltage.

In the present embodiment, the input duty ratio of the PWM integrating circuit 5, the output voltage of the integrating circuit and the output voltage of the regulator circuit have parameters as follows.

| Number | PWM positive duty ratio | Output voltage (V) of the integrating circuit | Output voltage (V) of the regulator circuit |
|---|---|---|---|
| 1 | 48.5% | 1.210 | 6.10 |
| 2 | 49.0% | 1.198 | 6.80 |
| 3 | 49.5% | 1.185 | 7.38 |
| 4 | 50.0% | 1.173 | 7.90 |
| 5 | 50.5% | 1.161 | 8.32 |
| 6 | 51.0% | 1.148 | 8.68 |
| 7 | 51.5% | 1.136 | 8.95 |
| 8 | 52.0% | 1.123 | 9.20 |
| 9 | 52.5% | 1.111 | 9.39 |
| 10 | 53.0% | 1.099 | 9.53 |
| 11 | 53.5% | 1.086 | 9.64 |
| 12 | 54.0% | 1.074 | 9.74 |
| 13 | 54.5% | 1.061 | 9.82 |
| 14 | 55.0% | 1.049 | 9.88 |
| 15 | 55.5% | 1.037 | 9.93 |
| 16 | 56.0% | 1.025 | 9.98 |
| 17 | 56.5% | 1.012 | 10.02 |
| 18 | 57.0% | 1.000 | 10.04 |
| 19 | 57.5% | 0.988 | 10.06 |
| 20 | 58.0% | 0.975 | 10.09 |
| 21 | 58.5% | 0.963 | 10.10 |

Figure 7:
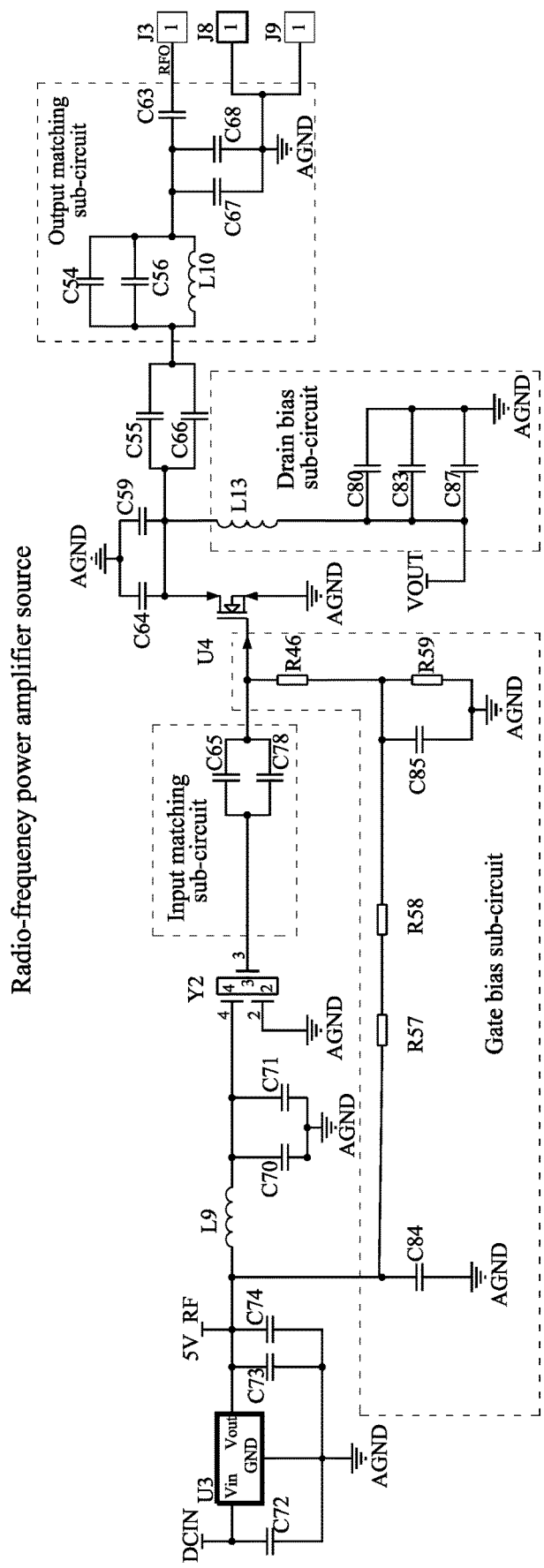
FIG. 7 is a circuit diagram of a radio-frequency power amplifier source according to the present invention.

As shown in FIG. 7, the radio-frequency power amplifier source 6 includes the regulator chip U3, the power amplifier tube U4, a gate bias sub-circuit, an input matching sub-circuit, a drain bias sub-circuit and an output matching sub-circuit. The end Vin of the chip U3 is connected to one end of the capacitor C72, the other end of the inductor L8 and the end Vin of the chip U8, respectively. The end Vout of the chip U3 is connected to one end of the capacitor C73, one end of the capacitor C74, the power source 5V-RF, one end of the inductor L9 and the gate bias sub-circuit, respectively. The end GND of the chip U3 is connected to the other end of the capacitor C74, the other end of the capacitor C73 and the other end of the capacitor C72, respectively, and is grounded. The other end of the inductor L9 is connected to the grounded capacitor C70, the grounded capacitor C71 and the $4^{th}$ pin of the connector Y2, respectively. The $2^{nd}$ pin of the connector Y2 is grounded, and the $3^{rd}$ pin of the connector Y2 is connected to the input matching sub-circuit.

The gate bias sub-circuit includes the capacitor C84, the resistor R57, the resistor R58, the capacitor C85, the resistor R59 and the resistor R46. One end of the capacitor C84 is connected to the end Vout of the chip U3 and one end of the resistor R57, respectively. The other end of the capacitor C84 is grounded. The other end of the resistor R57 is connected to one end of the resistor R58. The other end of the resistor R58 is connected to one end of the capacitor C85, one end of the resistor R59 and one end of the resistor R46, respectively. The other end of the resistor R59 is connected to the other end of the capacitor C85 and is grounded. The other end of the resistor R46 is connected to the input matching sub-circuit and the gate of the power amplifier tube U4, respectively. The source of the power amplifier tube U4 is grounded. The drain of the power amplifier tube U4 is connected to one end of the capacitor C64, one end of the capacitor C59, the drain bias sub-circuit, one end of the capacitor C55 and one end of the capacitor C66, respectively. The other end of the capacitor C64 is connected to the other end of the capacitor C59 and is grounded. The other end of the capacitor C55 is connected to the other end of the capacitor C66 and the output matching sub-circuit, respectively.

The input matching sub-circuit includes the capacitor C65 and the capacitor C78. One end of the capacitor C65 is connected to the $3^{rd}$ pin of the connector Y2 and one end of the capacitor C78, respectively. The other end of the capacitor C65 is connected to the other end of the capacitor C78 and the other end of the resistor R46, respectively, The drain bias sub-circuit includes the inductor L13, the capacitor C80, the capacitor C83 and the capacitor C87. One end of the inductor L13 is connected to the drain of the power amplifier tube U4. The other end of the inductor L13 is connected to one end of the capacitor C80, one end of the capacitor C83, one end of the capacitor C87 and the other end of the inductor L12, respectively. The other end of the capacitor C80 is connected to the other end of the capacitor C83 and the other end of the capacitor C87, respectively, and is grounded.

The output matching sub-circuit includes the capacitor C54, the capacitor C56, the inductor L10, the capacitor C67, the capacitor C68 and the capacitor C63. One end of the capacitor C54 is connected to one end of the capacitor C56, one end of the inductor L10 and the other end of the capacitor C55, respectively. The other end of the capacitor CM is connected to the other end of the capacitor C56, the other end of the inductor L10, one end of the capacitor C67, one end of the capacitor C68 and one end of the capacitor C63, respectively. The other end of the capacitor C67 is connected to the other end of the capacitor C68, the radio-frequency output terminal J8 and the radio-frequency output terminal J9, respectively, and is grounded. The other end of the capacitor C63 is connected to the radio-frequency output terminal J3.

In the present invention, a narrow-band matching scheme achieved by lumped elements is adopted in the radio-frequency power amplifier source, which effectively increases a transmission efficiency and greatly improves a wireless energy transmission efficiency of the system.

Figure 8:
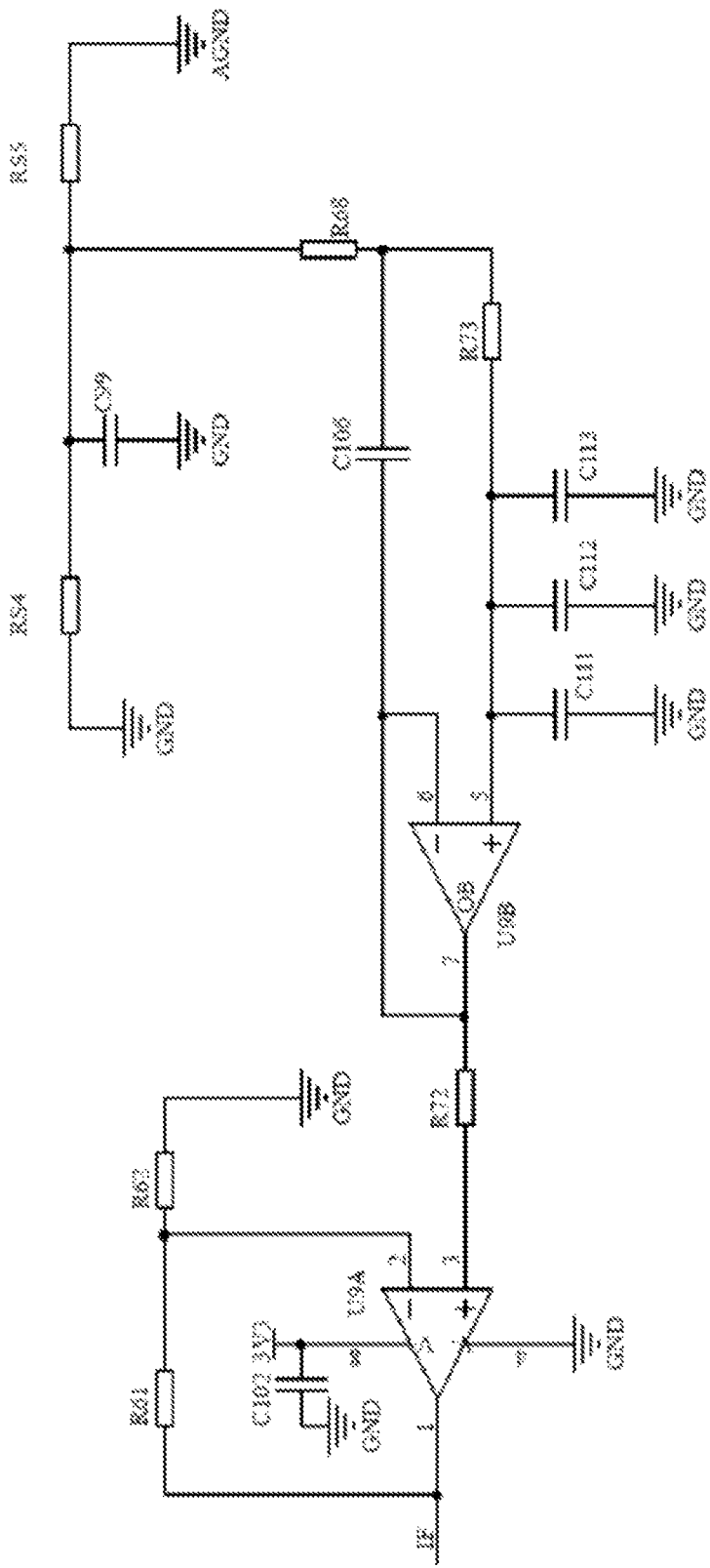
FIG. 8 is a circuit diagram of a radio-frequency current sampling circuit according to the present invention.
Figure 9A:
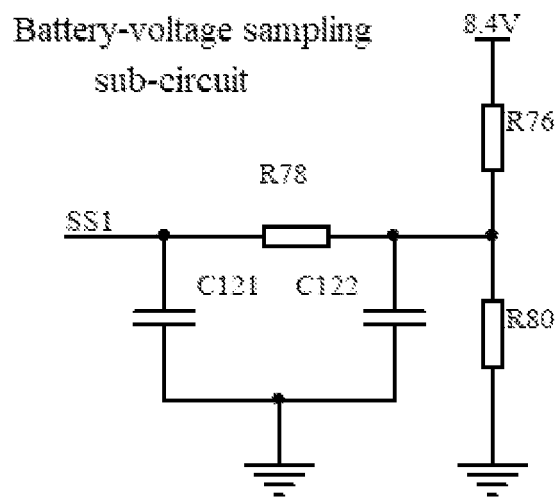
FIGS. 9(a)-9(d) show a circuit diagram of a charging control circuit according to the present invention.
Figure 9B:
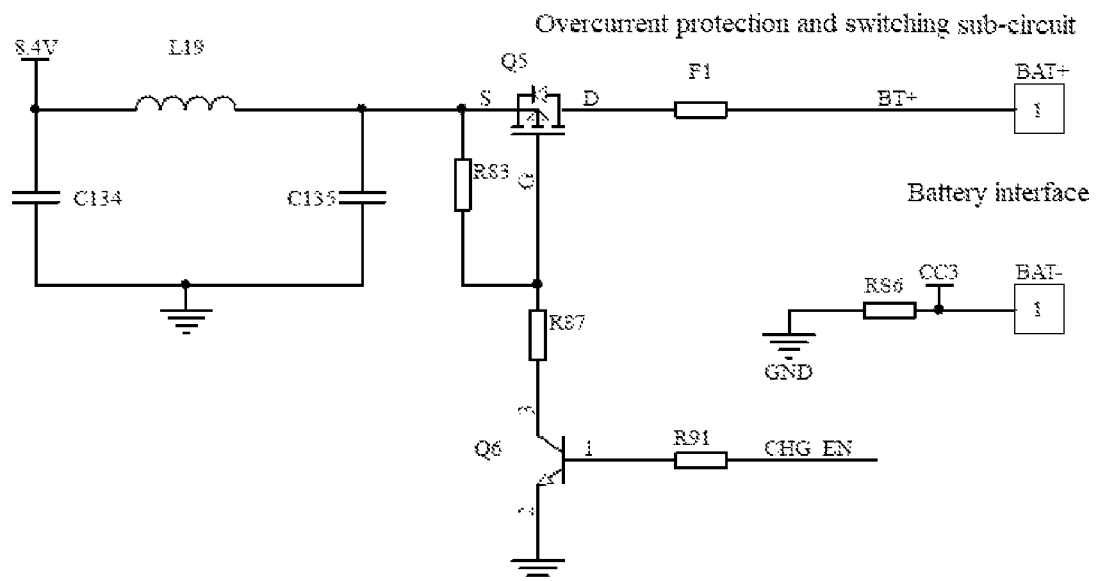
Figure 9C:
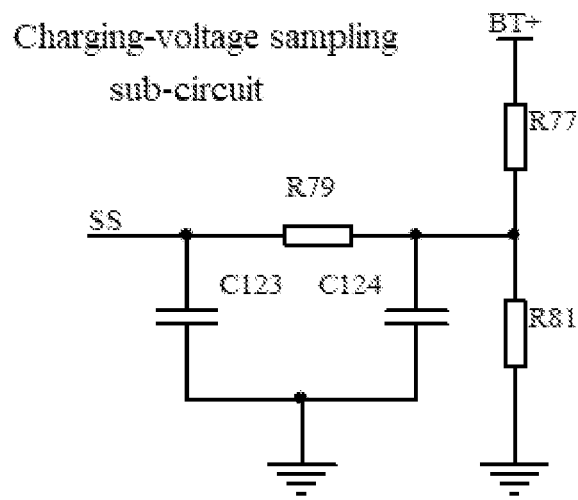
Figure 9D:
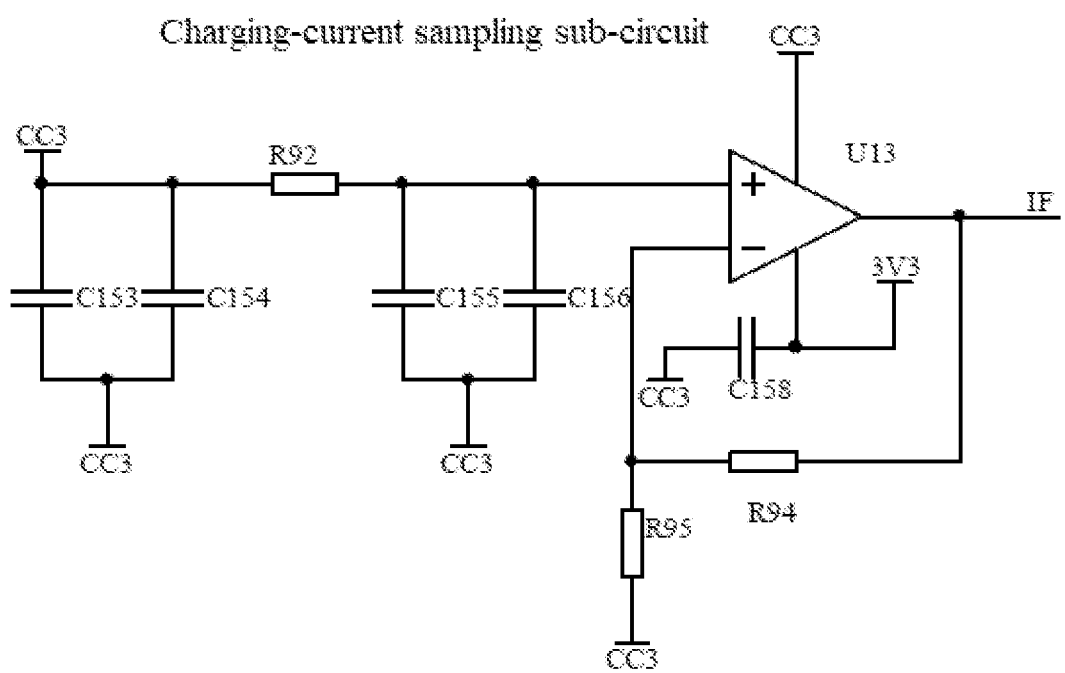

As shown in FIG. 8, the radio-frequency current sampling circuit 7 includes the radio-frequency operational amplifier chip U9A and the radio-frequency operational amplifier chip U9B. The non-inverting input end of the chip U9A is connected to one end of the resistor R72. The other end of the resistor R72 is connected to the output end OB of the chip U9B, the inverting input end of the chip U9B and one end of the capacitor C106, respectively. The inverting input end of the chip U9A is connected to the grounded resistor R62 and one end of the resistor R61, respectively. The other end of the resistor R61 is connected to the pin P06 of the chip U6 and the output end of the chip U9A, respectively. The pin V+ of the chip U9A is connected to the grounded capacitor C102 and the pin AVDD1 of the chip U6, respectively. The pin V− of the chip U9A is grounded. The other end of the capacitor C106 is connected to one end of the resistor R68 and one end of the resistor R73, respectively. The other end of the resistor R73 is connected to the grounded capacitor C113, the grounded capacitor C112, the grounded capacitor C111 and the non-inverting input end of the chip U9B, respectively. The other end of the resistor R68 is connected to one end of the sampling resistor RS5, the grounded capacitor C99 and one end of the sampling resistor RS4, respectively. The other end of the sampling resistor RS4 is grounded, and the other end of the sampling resistor RS5 is grounded.

In the present embodiment, the current sampling circuit constructed by the operational amplifier chip U9A and the operational amplifier chip U9B is configured to detect the normal current consumption of the radio-frequency power amplifier source 6. The chip of the Bluetooth master circuit can calculate the radio-frequency output power of the magnetic-resonance transmitting module 1 by detecting a value of the output voltage, and calculate a current magnetic-resonance wireless charging efficiency by comparison with charging power of the receiving end. When the efficiency is reduced, the Bluetooth master circuit at the transmitting end can change the output voltage of the regulator circuit by increasing the output voltage of the PWM integrating circuit 5 to further adjust the output power of the radio-frequency power amplifier source, thereby changing the transmission efficiency of the magnetic-resonance receiving and transmitting modules.

As shown in FIGS. 9(a)-9(d), the charging control circuit 10 includes a battery-voltage sampling sub-circuit, an overcurrent protection and switching sub-circuit, a charging-voltage sampling sub-circuit and a charging-current sampling sub-circuit. The battery-voltage sampling sub-circuit includes the resistor R76, the grounded resistor R80, the resistor R78, the capacitor C121 and the capacitor C122. One end of the resistor R76 is connected to the overcurrent protection and switching sub-circuit, the receiving rectifier and regulator circuit 11 and the anode of the diode D10, respectively. The other end of the resistor R76 is connected to the grounded resistor R80, one end of the capacitor C122 and one end of the resistor R78, respectively. The other end of the resistor R78 is connected to the pin P04 of the chip U6. The other end of the capacitor C121 is connected to the other end of the capacitor C122 and is grounded.

The overcurrent protection and switching sub-circuit includes the metal oxide semiconductor (MOS) transistor Q5, the fuse F1 and the triode Q6. The source of the MOS transistor Q5 is connected to one end of the resistor R83, one end of the capacitor C135 and one end of the inductor L19, respectively. The other end of the inductor L19 is connected to one end of the capacitor C134, the receiving rectifier and regulator circuit 11, the anode of the diode D10 and one end of the resistor R76, respectively. The other end of the capacitor C134 is connected to the other end of the capacitor C135 and is grounded. The gate of the MOS transistor Q5 is connected to the other end of the resistor R83 and one end of the resistor R87, respectively. The other end of the resistor R87 is connected to the collector of the triode Q6. The emitter of the triode Q6 is grounded, and the base of the triode Q6 is connected to one end of the resistor R91. The other end of the resistor R91 is connected to the pin P13 of the chip U6. The drain of the MOS transistor Q5 is connected to one end of the fuse F1, and the other end of the fuse F1 is connected to the anode of the lithium battery BT. The cathode of the lithium battery BT is connected to the grounded resistor RS6 and the charging-current sampling sub-circuit, respectively.

The charging-voltage sampling sub-circuit includes the resistor R77, the grounded resistor R81, the resistor R79, the capacitor C123 and the capacitor C124. One end of the resistor R77 is connected to the anode of the lithium battery. The other end of the resistor R77 is connected to the grounded resistor R81, one end of the capacitor C124 and one end of the resistor R79, respectively. The other end of the resistor R79 is connected to one end of the capacitor C123 and the pin P05 of the chip U6, respectively. The other end of the capacitor C123 is connected to the other end of the capacitor C124 and is grounded;

The charging-current sampling sub-circuit includes the operational amplifier chip U13. The power cathode end of the chip U13 is connected to the network CC3. The power supply pin of the chip U13 is connected to the pin AVDD1 of the chip U6 and one end of the capacitor C158, respectively. The other end of the capacitor C158 is connected to the network CC3. The non-inverting input end of the chip U13 is connected to one end of the capacitor C155, one end of the capacitor C156 and one end of the resistor R92, respectively. The other end of the resistor R92 is connected to one end of the capacitor C153, one end of the capacitor C154 and the network CC3, respectively. The other end of the capacitor C153 is connected to the other end of the capacitor C154 and the network CC3, respectively. The other end of the capacitor C155 is connected to the other end of the capacitor C156 and the network CC3, respectively. The inverting input end of the chip U13 is connected to one end of the resistor R94 and one end of the resistor R95, respectively. The other end of the resistor R95 is connected to the network CC3. The other end of the resistor R94 is connected to the output end of the chip U13 and the pin P06 of the chip U6, respectively.

In the present invention, the charging control circuit is configured to realize overcharge protection, over-discharge protection, overcurrent protection and temperature detection of the lithium battery by means of circuit integration. The overcharge protection means that a voltage across the lithium battery is detected and sent into the Bluetooth chip to be compared with a set highest charging threshold voltage, and when the detected voltage is larger than the set highest charging threshold voltage, the Bluetooth chip performs control to stop the charging process of the lithium battery. Similarly, the over-discharge protection means that the voltage across the lithium battery is detected and sent into the Bluetooth chip to be compared with a set lowest discharging threshold voltage, and when the detected voltage is lower than the lowest discharging threshold voltage, the Bluetooth chip performs control to stop the discharging process of the lithium battery. The overcurrent protection means that the charging current is detected, a detected maximum charging current is sent into the Bluetooth chip to be compared with a set maximum charging current, and when the detected maximum charging current is larger than the set maximum charging current, the Bluetooth chip performs control to stop the charging process of the lithium battery. The temperature detection means that a surface temperature of the lithium battery is detected, and the charging and discharging processes of the lithium battery are stopped when the detected temperature is larger than a normal temperature.

In the present embodiment, the fuse F1 ensures that the lithium battery is disconnected from the charging circuit in time when the current is excessively large. The fuse F1 is configured as a fast-fusing self-recovery surface mount fuse. The MOS transistor Q5 is configured to turn on and turn off the charging circuit. The charging-current sampling sub-circuit constructed by the operational amplifier chip U13 is configured to detect the charging current, and feeds the detected current information back to the Bluetooth master circuit 3 at the transmitting end through the Bluetooth slave circuit 9 at the receiving end. The charging-voltage sampling sub-circuit and the battery-voltage sampling sub-circuit are also provided to effectively monitor and safely control the charging process.

Figure 10A:
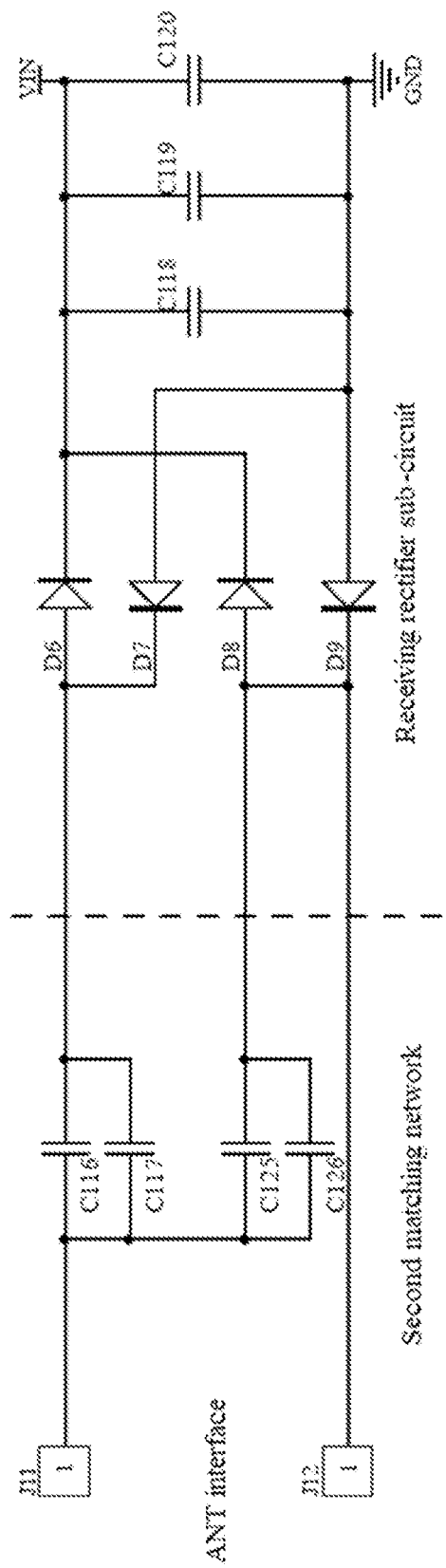
FIGS. 10(a)-10(b) show a circuit diagram of a receiving rectifier and regulator circuit according to the present invention.
Figure 10B:
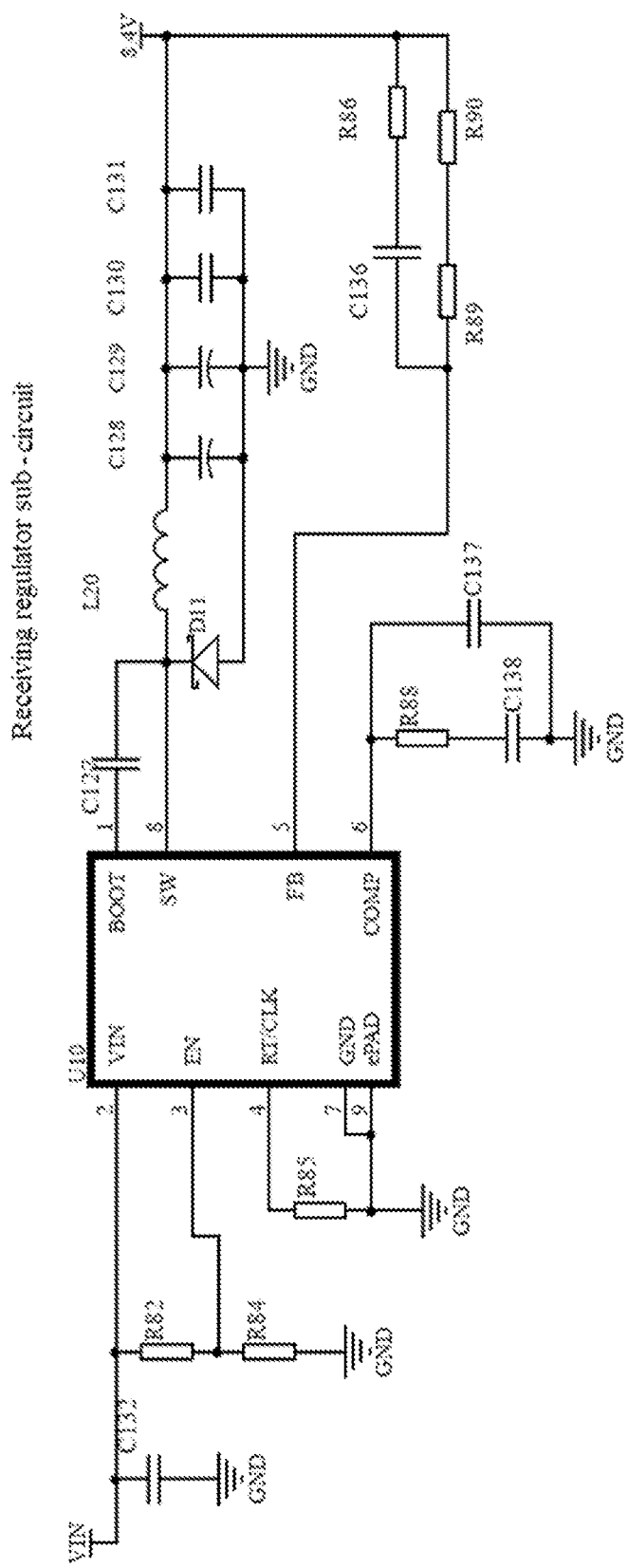

As shown in FIGS. 10(a)-10(b), the receiving rectifier and regulator circuit 11 includes a second matching network, a receiving rectifier sub-circuit and a receiving regulator sub-circuit. The second matching network includes the capacitor C116, the capacitor C117, the capacitor C125 and the capacitor C126. One end of the capacitor C116 is connected to one end of the capacitor C117, one end of the capacitor C125, one end of the capacitor C126 and the input end J11 of the magnetic-resonance transmitting antenna 8, respectively. The other end of the capacitor C116 is connected to the other end of the capacitor C117 and the receiving rectifier sub-circuit, respectively. The other end of the capacitor C125 is connected to the other end of the capacitor C126 and the receiving rectifier sub-circuit, respectively.

The receiving rectifier sub-circuit includes the diode D6, the diode D7, the diode D8, the diode D9, the capacitor C118, the capacitor C119 and the capacitor C120. The anode of the diode D6 is connected to the cathode of the diode D7 and the other end of the capacitor C116, respectively. The anode of the diode D7 is connected to the anode of the diode D9, one end of the capacitor C118, one end of the capacitor C119 and one end of the capacitor C120, respectively, and is grounded. The cathode of the diode D6 is connected to the cathode of the diode D8, the other end of the capacitor C118, the other end of the capacitor C119, the other end of the capacitor C120 and the receiving regulator sub-circuit, respectively. The anode of the diode D8 is connected to the cathode of the diode D9, the other end of the capacitor C125 and the input end J12 of the magnetic-resonance transmitting antenna 8, respectively.

The receiving regulator sub-circuit includes the voltage-drop integrated chip U10 and the diode D11. The pin VIN of the chip U10 is connected to one end of the resistor R82, the grounded capacitor C132 and the cathode of the diode D6, respectively. The pin EN of the chip U10 is connected to the grounded resistor R84 and the other end of the resistor R82, respectively. The pin RT/CLK of the chip U10 is connected to one end of the resistor R85. The pin GND of the chip U10 is connected to the pin ePAD of the chip U10 and the other end of the resistor R85, respectively, and is grounded. The pin BOOT of the chip U10 is connected to one end of the capacitor C127. The other end of the capacitor C127 is connected to the pin SW of the chip U10, the cathode of the diode D11 and one end of the inductor L20, respectively. The other end of the inductor L20 is connected to one end of the capacitor C128, one end of the capacitor C129, one end of the capacitor C130, one end of the capacitor C131, one end of the resistor R86, one end of the resistor R90, the other end of the inductor L19, the anode of the diode D10 and one end of the resistor R76, respectively. The anode of the diode D11 is connected to the other end of the capacitor C128, the other end of the capacitor C129, the other end of the capacitor C130 and the other end of the capacitor C131, respectively, and is grounded. The other end of the resistor R86 is connected to one end of the capacitor C136. The other end of the capacitor C136 is connected to one end of the resistor R89 and the pin FB of the chip U10, respectively. The other end of the resistor R89 is connected to the other end of the resistor R90. The pin COMP of the chip U10 is connected to one end of the resistor R88 and one end of the capacitor C137, respectively. The other end of the resistor R88 is connected to one end of the capacitor C138. The other end of the capacitor C138 is connected to the other end of the capacitor C137 and is grounded.

In the receiving rectifier and regulator circuit according to the present invention, a bridge rectifier of a bridge rectifier sub-circuit includes the four rectifier diodes, the diode D6, the diode D7, the diode D8, the diode D9, so as to convert a high-frequency alternating current received by the magnetic-resonance receiving antenna into a direct current. The receiving regulator sub-circuit includes the voltage-drop integrated chip U10 and a feedback circuit. The direct current after passing the bridge rectifier is fed into the voltage-drop integrated chip U10, and the value of the voltage can be set as needed by adjusting the value of the feedback pin, ensuring a stable and clean output voltage.

Figure 11:
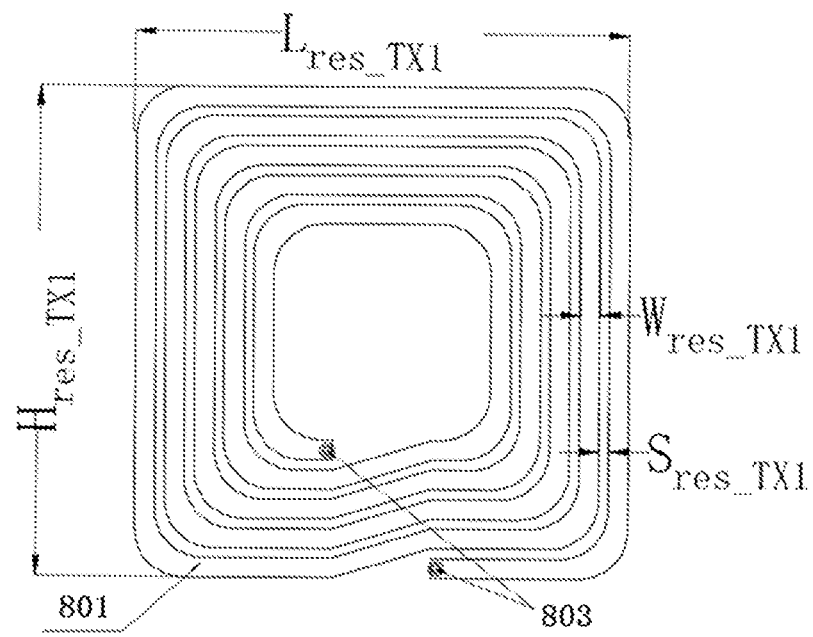
FIG. 11 shows a schematic diagram showing the structure of the front side of a magnetic-resonance transmitting antenna according to an embodiment of the present invention.
Figure 12:
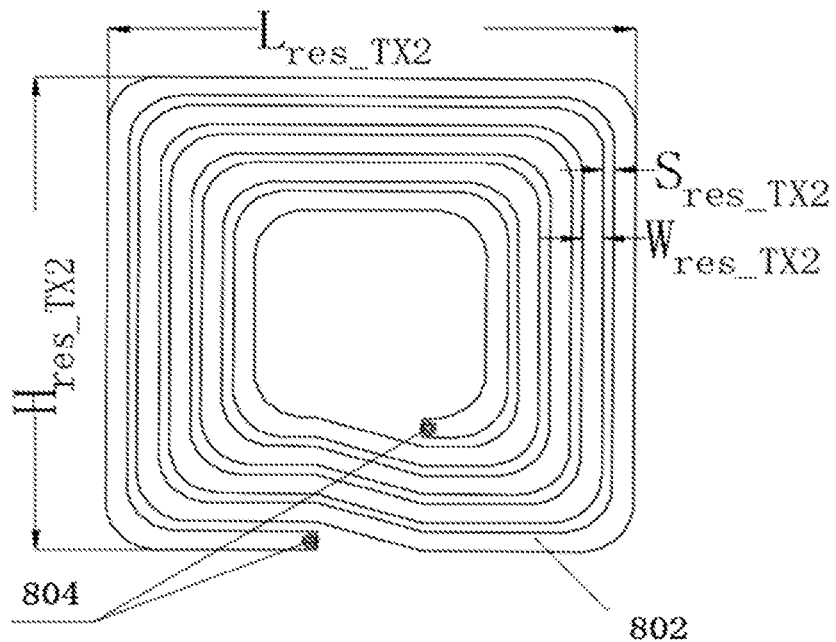
FIG. 12 shows a schematic diagram showing the structure of the back side of the magnetic-resonance transmitting antenna according to an embodiment of the present invention.

Both the magnetic-resonance transmitting antenna 8 and the magnetic-resonance receiving antenna 12 have a flat-plate structure. As shown in FIGS. 11-12, the first transmitting resonance coil 801 is arranged at the front side of the magnetic-resonance transmitting antenna 8, and the second transmitting resonance coil 802 is arranged at the back side of the magnetic-resonance transmitting antenna 8. Each of the first transmitting resonance coil 801 and the second transmitting resonance coil 802 is configured as a square spiral loop coil with a gap. The first transmitting resonance coil 801 is provided with the first connection point 803, and the second transmitting resonance coil 802 is provided with the second connection point 804. A through hole is arranged between the first connection point 803 and the second connection point 804.

Figure 13:
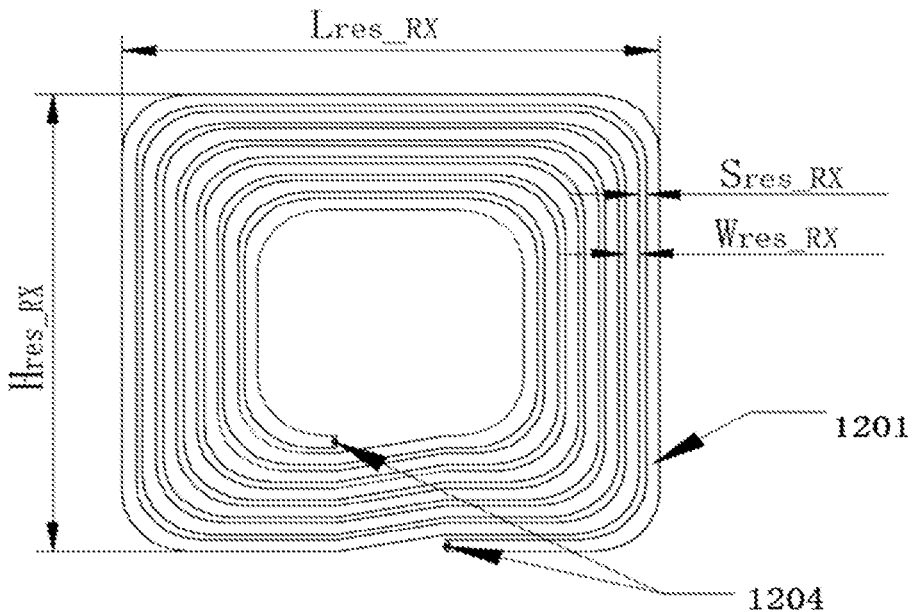
FIG. 13 shows a schematic diagram showing the structure of the front side of a magnetic-resonance receiving antenna according to an embodiment of the present invention.
Figure 14:
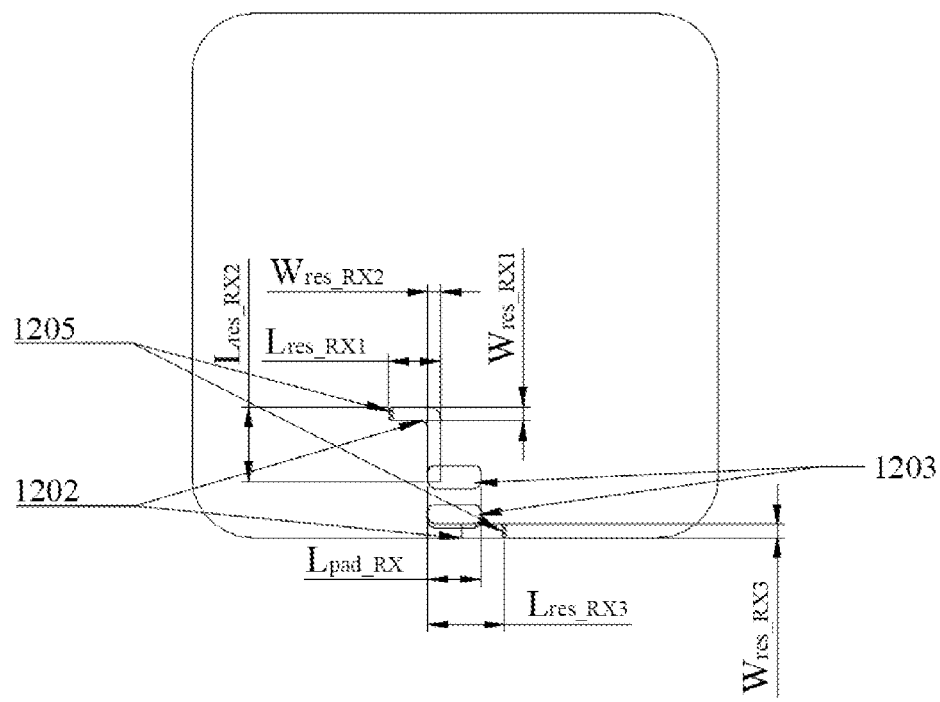
FIG. 14 shows a schematic diagram showing the structure of the back side of the magnetic-resonance receiving antenna according to an embodiment of the present invention.

As shown in FIGS. 13-14, the receiving resonance coil 1201 is arranged at the front side of the magnetic-resonance receiving antenna 12, and the microstrip line 1202 and the pad 1203 are arranged at the back side of the magnetic-resonance receiving antenna 12. The receiving resonance coil 1201 is configured as a square spiral loop coil with a gap, and the receiving resonance coil 1201 is provided with the third connection point 1204. The microstrip line 1202 is divided into three segment microstrip lines. The first segment microstrip line and the second segment microstrip line are connected to each other perpendicularly. Two pads 1203 are arranged between the second segment microstrip line and the third segment microstrip line. The microstrip line 1202 is connected to the receiving rectifier and regulator circuit 11 through the pads 1203. The first segment microstrip line and the third segment microstrip line are provided with the fourth connection point 1205, respectively. A through hole is arranged between the third connection point 1204 and the fourth connection point 1205. In the present invention, a planar printed circuit board is adopted to process the structures of the magnetic-resonance transmitting antenna and the magnetic-resonance receiving antenna, which realizes miniaturization and integration of the system, and greatly reduces costs of production, mounting and maintenance of the system.

In the present embodiment, both the magnetic-resonance transmitting antenna 8 and the magnetic-resonance receiving antenna 12 have a flat-plate structure, and are made of double-layer printed circuit boards with a thickness of 0.6 mm to 1.0 mm. After the structures of the magnetic-resonance transmitting antenna 8 and the magnetic-resonance receiving antenna 12 are designed, corresponding resonance capacitors and matching circuits are added to the magnetic-resonance transmitting antenna 8 and the magnetic-resonance receiving antenna 12 to realize the same-frequency magnetic resonance thereof. Each of the connection points has a specific position as shown in FIGS. 11 to 14, and every two connection points with a through hole therebetween are connected by the microstrip line provided in the through hole. According to the reference numerals in the structural diagrams shown in FIGS. 11 to 14, geometric parameters and electrical parameters of the magnetic-resonance transmitting antenna and the magnetic-resonance receiving antenna are set as follows in conjunction with practical application requirements.

(1) The geometric and electrical parameters of the magnetic-resonance transmitting antenna 8 are set as follows:

an external length $L_{res\_TX1}$ of the first transmitting resonance coil 801 is 50 mm to 150 mm;

an external width $H_{res\_TX1}$ of the first transmitting resonance coil 801 is 50 mm to 150 mm;

a width $W_{res\_TX1}$ of the microstrip line in the first transmitting resonance coil 801 is 3 mm to 5 mm;

a distance $S_{res\_TX1}$ between the microstrip lines in the first transmitting resonance coil 801 is 1 mm to 3 mm;

an external length $L_{res\_TX2}$ of the second transmitting resonance coil 802 is 50 mm to 150 mm;

an external width $H_{res\_TX2}$ of the second transmitting resonance coil 802 is 50 mm to 150 mm;

a width $W_{res\_TX2}$ of the microstrip line in the second transmitting resonance coil 802 is 3 mm to 5 mm;

a distance $S_{res\_TX2}$ between the microstrip lines in the second transmitting resonance coil 802 is 1 mm to 3 mm;

a resonant capacitance value of the magnetic-resonance transmitting antenna 8 is 100 pF to 500 pF; and a matching capacitance value of the magnetic-resonance transmitting antenna 8 is 100 pF to 500 pF.

(2) The geometric and electrical parameters of the magnetic-resonance receiving antenna 12 are set as follows:

an external length $L_{res\_RX}$ of the receiving resonance coil 1201 is 30 mm to 50 mm;

an external width $H_{res\_RX}$ of the receiving resonance coil 1201 is 30 mm to 50 mm;

a width $W_{res\_RX}$ of the microstrip line in the receiving resonance coil 1201 is 0.5 mm to 1.5 mm;

a distance $S_{res\_RX}$ between the microstrip lines in the receiving resonance coil 1201 is 0.3 mm to 0.7 mm;

a length $L_{res\_RX1}$ of the first segment microstrip line is 3 mm to 5 mm;

a width $W_{res\_RX1}$ of the first segment microstrip line is 0.5 mm to 1.5 mm;

a length $L_{res\_RX2}$ of the second segment microstrip line is 5 mm to 7 mm;

a width $W_{res\_RX2}$ of the second segment microstrip line is 0.5 mm to 1.5 mm;

a length $L_{res\_RX3}$ of the third segment microstrip line is 5 mm to 7 mm;

a width $W_{res\_RX3}$ of the third segment microstrip line is 0.5 mm to 1.5 mm;

a length $L_{pad\_RX}$ of the pad 1203 is 3 mm to 5 mm;

a width $W_{pad\_RX}$ of the pad 1203 is 1 mm to 3 mm;

a resonant capacitance value of the magnetic-resonance receiving antenna 12 is 100 pF to 500 pF; and a matching capacitance value of the magnetic-resonance receiving antenna 12 is 100 pF to 500 pF.

In the present embodiment, the magnetic-resonance transmitting module 1 directly supplies power to the magnetic-resonance receiving module 2 using the magnetic-resonance wireless charging technology, so as to further charge the apparatus. The electromagnetic energy with a frequency of 6.78 MHz is generated by the wireless charging base, transmitted by the magnetic-resonance transmitting antenna 8, and then directionally transferred to the magnetic-resonance receiving antenna 12 through the same-frequency magnetic resonance coupling effect between the magnetic-resonance receiving and transmitting antennas. The magnetic-resonance receiving antenna 12 is connected to the receiving rectifier and regulator circuit 11. The receiving rectifier and regulator circuit 11 is connected to the Bluetooth slave circuit 9 and is controlled by the Bluetooth slave circuit 9 to charge the charging control circuit 10. The charging control circuit 10 is connected to a load apparatus, such as a battery, or the like. The working frequency designed in the embodiment is not limited to 6.78 MHz, and may be adjusted within the usable frequency range of 5 MHz to 20 MHz. As shown in FIGS. 4(*a*)-4(*c*), when the working frequency is 6.78 MHz, an efficiency of wireless energy transmission between the magnetic-resonance transmitting antenna 8 and the magnetic-resonance receiving antenna 12 may be kept above 80%, and therefore, the working frequency is preferably 6.78 MHz in the embodiment of the present invention.

In the present embodiment, the magnetic-resonance transmitting module 1 provides various output interfaces for voltages of 3.3 V to 15 V, so as to meet requirements of input voltages of different electric apparatus. The total wireless power-supply power provided by the system reaches up to 100 W, which can stably and efficiently supply electric energy to magnetic induction apparatus with different voltage interfaces and different power requirements.

In the present embodiment, the magnetic-resonance receiving module 2 provides various output interfaces for voltages of 3.3 V to 15 V, so as to meet requirements of input voltages of different electric apparatus. The total wireless power-supply power provided by the system reaches up to 100 W, which can stably and efficiently supply electric energy to magnetic induction apparatus with different voltage interfaces and different power requirements.

In the antenna structure of the present invention, the adopted geometric parameters can effectively improve quality factors of the magnetic-resonance receiving and transmitting antennas, and the adopted electrical parameters can effectively improve coupling coefficients of the magnetic-resonance receiving and transmitting antennas, thereby greatly increasing the efficiency of transmission between the magnetic-resonance receiving and transmitting antennas.

What is claimed is:

1. A device for controlling wireless charging output power based on a PWM integrating circuit, comprising a magnetic-resonance transmitting module and a magnetic-resonance receiving module connected to the magnetic-resonance transmitting module; wherein, the magnetic-resonance transmitting module comprises a wireless charging base, a Bluetooth master circuit, a DC/DC regulator circuit, a PWM integrating circuit, a radio-frequency power amplifier source, a radio-frequency current sampling circuit and a magnetic-resonance transmitting antenna; wherein, the DC/DC regulator circuit, the PWM integrating circuit, the radio-frequency power amplifier source, the radio-frequency current sampling circuit and the magnetic-resonance transmitting antenna are connected to the Bluetooth master circuit, respectively; the radio-frequency power amplifier source and the magnetic-resonance transmitting antenna are mounted at the wireless charging base; the magnetic-resonance transmitting antenna is connected to the magnetic-resonance receiving module; and the magnetic-resonance receiving module comprises a cooling fin, a magnetic-resonance receiving antenna, a Bluetooth slave circuit, a receiving rectifier and regulator circuit and a charging control circuit; wherein, the receiving rectifier and regulator circuit and the charging control circuit are connected to the Bluetooth slave circuit, respectively; the magnetic-resonance receiving antenna, the receiving rectifier and regulator circuit and the charging control circuit are connected successively; the receiving rectifier and regulator circuit and the Bluetooth slave circuit are fixed at an upper surface of the cooling fin; the magnetic-resonance receiving antenna is arranged directly above the magnetic-resonance transmitting antenna;

wherein, the Bluetooth master circuit and the Bluetooth slave circuit have a same structure, and each of the Bluetooth master circuit and the Bluetooth slave circuit comprises a Bluetooth chip U6; the Bluetooth master circuit further comprises a first LDO sub-circuit, and the first LDO sub-circuit comprises a regulator chip U8; the Bluetooth slave circuit further comprises a second LDO sub-circuit, and the second LDO sub-circuit comprises a regulator chip U11;

a pin AVDD1 of the Bluetooth chip U6 is connected to a pin AVDD2 of the Bluetooth chip U6, a pin AVDD3 of the Bluetooth chip U6, a pin AVDD4 of the Bluetooth chip U6, a pin AVDD5 of the Bluetooth chip U6, a pin AVDD6 of the Bluetooth chip U6, a grounded capacitor C95, a grounded capacitor C94, a grounded capacitor C93, a grounded capacitor C92, a grounded capacitor C91, a grounded capacitor C90, a pin DVDD1 of the Bluetooth chip U6, a first end of a resistor R71, a pin NC of the Bluetooth chip U6, the regulator chip U11 and the regulator chip U8, respectively;

the pin DVDD1 of the Bluetooth chip U6 is further connected to a pin DVDD2 of the Bluetooth chip U6, a first end of a capacitor C101 and a first end of a capacitor C100, respectively; a second end of the capacitor C101 is connected to a second end of the capacitor C100, and the second end of the capacitor C101 and the second end of the capacitor C100 are grounded;

a pin DCOUPL of the Bluetooth chip U6 is connected to a first end of a capacitor C104; a second end of the capacitor C104 is connected to a first end of a capacitor C107, a pin GND of the Bluetooth chip U6 and a pin ePAD of the Bluetooth chip U6, respectively, and the second end of the capacitor C104, the first end of the capacitor C107, the pin GND of the Bluetooth chip U6 and the pin ePAD of the Bluetooth chip U6 are grounded; a second end of the capacitor C107 is connected to the pin NC of the Bluetooth chip U6;

a pin REST of the Bluetooth chip U6 is connected to a grounded capacitor C110 and a second end of the resistor R71, respectively;

a pin R_BIAS of the Bluetooth chip U6 is connected to a first end of a resistor R75; a second end of the resistor R75 is connected to a $4^{th}$ pin of a crystal oscillator Y3, and the second end of the resistor R75 and the $4^{th}$ pin of the crystal oscillator Y3 are grounded;

a pin XSOC_Q1 of the Bluetooth chip U6 is connected to a $1^{st}$ pin of the crystal oscillator Y3 and a first end of a capacitor C114, respectively; a pin XSOC_Q2 of the Bluetooth chip U6 is connected to a first end of a capacitor C115 and a $3^{rd}$ pin of the crystal oscillator Y3, respectively; a second end of the capacitor C115 is connected to a $2^{nd}$ pin of the crystal oscillator Y3 and a second end of the capacitor C114, respectively, and the second end of the capacitor C115, the $2^{nd}$ pin of the crystal oscillator Y3 and the second end of the capacitor C114 are grounded;

a pin RF_P of the Bluetooth chip U6 is connected to a first end of a capacitor C88; a second end of the capacitor C88 is connected to a first end of a capacitor C89 and a first end of an inductor L14, respectively; a second end of the inductor L14 is grounded; a second end of the capacitor C89 is connected to a first end of an inductor L17 and a first end of an inductor L15, respectively; a second end of the inductor L17 is connected to a first end of a capacitor C96 and a grounded capacitor C98, respectively; a second end of the capacitor C96 is connected to a pin RF_N of the Bluetooth chip U6; a second end of the inductor L15 is connected to a grounded capacitor C97 and a first end of an inductor L16, respectively; a second end of the inductor L16 is connected to a first end of the magnetic-resonance transmitting antenna, and a second end of the magnetic-resonance transmitting antenna is grounded;

a pin P11 of the Bluetooth chip U6 is connected to the PWM integrating circuit a pin P06 of the Bluetooth chip U6 and a pin P12 of the Bluetooth chip U6 are connected to the DC/DC regulator circuit, respectively; a pin P06 of the Bluetooth chip U6 is connected to the charging control circuit and the radio-frequency current sampling circuit, respectively; a pin P07 of the Bluetooth chip U6 is connected to the DC/DC regulator circuit a pin P13 of the Bluetooth chip U6, a pin PO4 of the Bluetooth chip U6 and a pin P05 of the Bluetooth chip U6 are connected to the charging control circuit, respectively;

an end Vin of the regulator chip U8 is connected to a first end of a capacitor CC1, the radio-frequency power amplifier source and the DC/DC regulator circuit, respectively;

an end Vout of the regulator chip U8 is connected to a first end of an inductor L18; a second end of the inductor L18 is connected to the pin AVDD1 of the Bluetooth chip U6 and a first end of a capacitor CC2, respectively;

a grounded end GND of the regulator chip U8 is connected to a second end of the capacitor CC1 and a second end of the capacitor CC2, respectively, and the grounded end GND of the regulator chip U8, the second end of the capacitor CC1 and the second end of the capacitor CC2 are grounded; and a pin Vin of the regulator chip U11 is connected to a first end of a capacitor CC31, a grounded capacitor C133 and a first end of an inductor L21, respectively; a second end of the inductor L21 is connected to a cathode of a diode D10 and a cathode of a diode D12, respectively; an anode of the diode D10 is connected to the receiving rectifier and regulator circuit and the charging control circuit, respectively; an anode of the diode D12 is connected to an anode of a lithium battery BT;

a pin Vout of the regulator chip U11 is connected to a first end of an inductor L22; a second end of the inductor L22 is connected to the pin AVDD1 of the Bluetooth chip U6 and a first end of a capacitor CC4, respectively; a second end of the capacitor CC4 is connected to a pin GND of the regulator chip U11 and a second end of the capacitor CC31, respectively, and the second end of the capacitor CC4, the pin GND of the regulator chip U11 and the second end of the capacitor CC31 are grounded.

2. The device according to claim 1, wherein, the DC/DC regulator circuit comprises a DC/DC rectifier sub-circuit, a current and voltage detection sub-circuit and a voltage output control sub-circuit;

the DC/DC rectifier sub-circuit comprises a rectifier chip U1; wherein,
  a pin IN of the rectifier chip U1 is connected to a grounded capacitor C62, a first end of a resistor R44, an anode of a polar capacitor C61, a grounded capacitor C60 and a first end of an inductor L8, respectively; a second end of the inductor L8 is connected to the end Vin of the regulator chip U8 and a grounded capacitor C57, respectively; a cathode of the polar capacitor C61 is grounded;
  a pin EN of the rectifier chip U1 is connected to a second end of the resistor R44 and a grounded resistor R45, respectively;
  a pin VCC of the rectifier chip U1 is connected to a grounded capacitor C82;
  a pin GND of the rectifier chip U1 is grounded;
  a pin FB of the rectifier chip U1 is connected to a first end of a capacitor C79, a first end of a resistor R54, a cathode of a diode D4 and a cathode of a diode D5, respectively; an anode of the diode D5 is connected to the PWM integrating circuit, and an anode of the diode D4 is connected to the current and voltage detection sub-circuit; a second end of the capacitor C79 is connected to a first end of a resistor R47; a second end of the resistor R47 is connected to a first end of a resistor R50, the current and voltage detection sub-circuit, a grounded capacitor C77, a grounded capacitor C76, a grounded capacitor C75 and a first end of an inductor L11, respectively; a second end of the resistor R50 is connected to a second end of the resistor R54 and a grounded resistor R55, respectively;
  a pin SW of the rectifier chip U1 is connected to a first end of a capacitor C58 and a second end of the inductor L11, respectively; a second end of the capacitor C58 is connected to a first end of a resistor R43, and a second end of the resistor R43 is connected to a pin RST of the rectifier chip U1;

the current and voltage detection sub-circuit comprises a detection chip U5; wherein,
  a pin IN+ of the detection chip U5 is connected to a pin V+ of the detection chip U5, the second end of the resistor R47, a first end of a capacitor C81 and a first end of a sampling resistor RSA1, respectively;
  a pin REF of the detection chip U5 is connected to a second end of the capacitor C81 and a pin GND of the detection chip U5, respectively, and the pin REF of the detection chip U5, the second end of the capacitor C81 and the pin GND of the detection chip U5 are grounded;
  a pin OUT of the detection chip U5 is connected to the anode of the diode D4;
  a pin IN- of the detection chip U5 is connected to a second end of the sampling resistor RSA1, a first end of a resistor R51 and the voltage output control sub-circuit, respectively; a second end of the resistor R51 is connected to a first end of a resistor R53 and a first end of a resistor R60, respectively; a second end of the resistor R53 is connected to the pin P07 of the Bluetooth chip U6 and a first end of a capacitor C86, respectively; a second end of the resistor R60 is connected to a second end of the capacitor C86, and the second end of the resistor R60 and the second end of the capacitor C86 are grounded; and the voltage output control sub-circuit comprises a PMOS transistor U2; wherein,
  a source of the PMOS transistor U2 is connected to the pin IN- of the detection chip U5 and a first end of a resistor R48, respectively;
  a gate of the PMOS transistor U2 is connected to a second end of the resistor R48 and a first end of a resistor R49, respectively; a second end of the resistor R49 is connected to a collector of a triode Q3; an emitter of the triode Q3 is connected to a first end of a resistor R56, and the emitter of the triode Q3 and the first end of the resistor R56 are grounded; a base of the triode Q3 is connected to a first end of a resistor R52 and a second end of the resistor R56, respectively; a second end of the resistor R52 is connected to a pin P12 of the Bluetooth chip U6;
  a drain of the PMOS transistor U2 is connected to a grounded capacitor C69 and a first end of an inductor L12, respectively; and a second end of the inductor L12 is connected to the radio-frequency power amplifier source.

3. The device according to claim 2, wherein, the PWM integrating circuit comprises an operational amplifier chip U7A, an operational amplifier chip U7B, an operational amplifier chip N1A, an operational amplifier chip N1B and an NMOS transistor Q4;
  a gate of the NMOS transistor Q4 is connected to a first end of a resistor R70, and a second end of the resistor R70 is connected to the pin P11 of the Bluetooth chip U6;
  a source of the NMOS transistor Q4 is grounded;
  a drain of the NMOS transistor Q4 is connected to a first end of a resistor R65, a grounded resistor R74 and a first end of a resistor R66, respectively;
  a second end of the resistor R65 is connected to the pin AVDD1 of the Bluetooth chip U6; a second end of the resistor R66 is connected to a first end of a resistor R67 and a first end of a capacitor C103, respectively; a second end of the resistor R67 is connected to a grounded capacitor C109 and a non-inverting input end of the operational amplifier chip U7B, respectively; a second end of the capacitor C103 is connected to a first end of a resistor R63 and an inverting input end of the operational amplifier chip U7B, respectively; a second end of the resistor R63 is connected to a first end of a resistor R69 and an output end OB of the operational amplifier chip U7B, respectively; a second end of the resistor R69 is connected to a non-inverting input end of the operational amplifier chip U7A;
  an inverting input end of the operational amplifier chip U7A is connected to a first end of a resistor R64;
  an output end of the operational amplifier chip U7A is connected to a second end of the resistor R64, a grounded capacitor C108 and a first end of a resistor R2, respectively;
  a pin V- of the operational amplifier chip U7A is connected to a first end of a capacitor C105, and the pin V- of the operational amplifier chip U7A and the first end of a capacitor C105 are grounded;

a pin V+ of the operational amplifier chip U7A is connected to the pin AVDD1 of the Bluetooth chip U6 and a second end of the capacitor C105, respectively;

a second end of the resistor R2 is connected to a grounded capacitor C3, a grounded capacitor C4 and a first end of a resistor R3, respectively; a second end of the resistor R3 is connected to a first end of a capacitor C5 and a first end of a resistor R4, respectively; a second end of the resistor R4 is connected to a grounded capacitor C6 and a non-inverting input end of the operational amplifier chip N1B, respectively;

an inverting input end of the operational amplifier chip N1B is connected to a second end of the capacitor C5, an output end OB of the operational amplifier chip N1B and a non-inverting input end of the operational amplifier chip N1A, respectively;

an inverting input end of the operational amplifier chip N1A is connected to an output end of the operational amplifier chip N1A and the anode of the diode D5, respectively;

a pin V− of the operational amplifier chip N1A is connected to a first end of a capacitor C1 and a first end of a capacitor C2, respectively, and the pin V− of the operational amplifier chip N1A, the first end of the capacitor C1 and the first end of the capacitor C2 are grounded;

a pin V+ of the operational amplifier chip N1A is connected to a first end of a resistor R1, a second end of the capacitor C2 and a second end of the capacitor C1, respectively; a second end of the resistor R1 is connected to a first end of an inductor FB1, and a second end of the inductor FB1 is connected to the pin AVDD1 of the Bluetooth chip U6.

4. The device according to claim 2, wherein, the radio-frequency power amplifier source comprises a regulator chip U3, a power amplifier tube U4, a gate bias sub-circuit, an input matching sub-circuit, a drain bias sub-circuit and an output matching sub-circuit;

an end Vin of the regulator chip U3 is connected to a first end of a capacitor C72, the second end of the inductor L8 and the end Vin of the regulator chip U8, respectively;

an end Vout of the regulator chip U3 is connected to a first end of a capacitor C73, a first end of a capacitor C74, a power source 5V-RF, a first end of an inductor L9 and the gate bias sub-circuit, respectively;

an end GND of the regulator chip U3 is connected to a second end of the capacitor C74, a second end of the capacitor C73 and a second end of the capacitor C72, respectively, and the end GND of the regulator chip U3, the second end of the capacitor C74, the second end of the capacitor C73 and the second end of the capacitor C72 are grounded; a second end of the inductor L9 is connected to a grounded capacitor C70, a grounded capacitor C71 and a $4^{th}$ pin of a connector Y2, respectively; a $2^{nd}$ pin of the connector Y2 is grounded, and a $3^{rd}$ pin of the connector Y2 is connected to the input matching sub-circuit;

the gate bias sub-circuit comprises a capacitor C84, a resistor R57, a resistor R58, a capacitor C85, a resistor R59 and a resistor R46; wherein, a first end of the capacitor C84 is connected to the end Vout of the regulator chip U3 and a first end of the resistor R57, respectively; a second end of the capacitor C84 is grounded; a second end of the resistor R57 is connected to a first end of the resistor R58; a second end of the resistor R58 is connected to a first end of the capacitor C85, a first end of the resistor R59 and a first end of the resistor R46, respectively; a second end of the resistor R59 is connected to a second end of the capacitor C85, and the second end of the resistor R59 and the second end of the capacitor C85 are grounded; a second end of the resistor R46 is connected to the input matching sub-circuit and a gate of the power amplifier tube U4, respectively;

a source of the power amplifier tube U4 is grounded;

a drain of the power amplifier tube U4 is connected to a first end of a capacitor C64, a first end of a capacitor C59, the drain bias sub-circuit, a first end of a capacitor C55 and a first end of a capacitor C66, respectively; a second end of the capacitor C64 is connected to a second end of the capacitor C59, and the second end of the capacitor C64 and the second end of the capacitor C59 are grounded; a second end of the capacitor C55 is connected to a second end of the capacitor C66 and the output matching sub-circuit, respectively;

the input matching sub-circuit comprises a capacitor C65 and a capacitor C78; wherein, a first end of the capacitor C65 is connected to the $3^{rd}$ pin of the connector Y2 and a first end of the capacitor C78, respectively; and a second end of the capacitor C65 is connected to a second end of the capacitor C78 and the second end of the resistor R46, respectively;

the drain bias sub-circuit comprises an inductor L13, a capacitor C80, a capacitor C83 and a capacitor C87; wherein, a first end of the inductor L13 is connected to the drain of the power amplifier tube U4; a second end of the inductor L13 is connected to a first end of the capacitor C80, a first end of the capacitor C83, a first end of the capacitor C87 and the second end of the inductor L12, respectively;

a second end of the capacitor C80 is connected to a second end of the capacitor C83 and a second end of the capacitor C87, respectively, and the second end of the capacitor C80, the second end of the capacitor C83 and the second end of the capacitor C87 are grounded; and the output matching sub-circuit comprises a capacitor C54, a capacitor C56, an inductor L10, a capacitor C67, a capacitor C68 and a capacitor C63; wherein, a first end of the capacitor CM is connected to a first end of the capacitor C56, a first end of the inductor L10 and the second end of the capacitor C55, respectively; a second end of the capacitor CM is connected to a second end of the capacitor C56, a second end of the inductor L10, a first end of the capacitor C67, a first end of the capacitor C68 and a first end of the capacitor C63, respectively; a second end of the capacitor C67 is connected to a second end of the capacitor C68, a radio-frequency output terminal J8 and a radio-frequency output terminal J9, respectively, and the second end of the capacitor C67, the second end of the capacitor C68, the radio-frequency output terminal J8 and the radio-frequency output terminal J9 are grounded; and a second end of the capacitor C63 is connected to a radio-frequency output terminal J3.

5. The device according to claim 1, wherein, the radio-frequency current sampling circuit comprises a radio-frequency operational amplifier chip U9A and a radio-frequency operational amplifier chip U9B;
- a non-inverting input end of the radio-frequency operational amplifier chip U9A is connected to a first end of a resistor R72; a second end of the resistor R72 is connected to an output end OB of the radio-frequency operational amplifier chip U9B, an inverting input end of the radio-frequency operational amplifier chip U9B and a first end of a capacitor C106, respectively;
- an inverting input end of the radio-frequency operational amplifier chip U9A is connected to a grounded resistor R62 and a first end of a resistor R61, respectively; a second end of the resistor R61 is connected to the pin P06 of the Bluetooth chip U6 and an output end of the radio-frequency operational amplifier chip U9A, respectively;
- a pin V+ of the radio-frequency operational amplifier chip U9A is connected to a grounded capacitor C102 and the pin AVDD1 of the Bluetooth chip U6, respectively;
- a pin V− of the radio-frequency operational amplifier chip U9A is grounded;
- a second end of the capacitor C106 is connected to a first end of a resistor R68 and a first end of a resistor R73, respectively; a second end of the resistor R73 is connected to a grounded capacitor C113, a grounded capacitor C112, a grounded capacitor C111 and a non-inverting input end of the radio-frequency operational amplifier chip U9B, respectively; a second end of the resistor R68 is connected to a first end of a sampling resistor RS5, a grounded capacitor C99 and a first end of a sampling resistor RS4, respectively; a second end of the sampling resistor RS4 is grounded, and a second end of the sampling resistor RS5 is grounded.

6. The device according to claim 1, wherein, the charging control circuit comprises a battery-voltage sampling sub-circuit, an overcurrent protection and switching sub-circuit, a charging-voltage sampling sub-circuit and a charging-current sampling sub-circuit;
- the battery-voltage sampling sub-circuit comprises a resistor R76, a grounded resistor R80, a resistor R78, a capacitor C121 and a capacitor C122; wherein,
  - a first end of the resistor R76 is connected to the overcurrent protection and switching sub-circuit, the receiving rectifier and regulator circuit and the anode of the diode D10, respectively;
- a second end of the resistor R76 is connected to the grounded resistor R80, a first end of the capacitor C122 and a first end of the resistor R78, respectively; a second end of the resistor R78 is connected to the pin PO4 of the Bluetooth chip U6; a second end of the capacitor C121 is connected to a second end of the capacitor C122, and the second end of the capacitor C121 and the second end of the capacitor C122 are grounded;
- the overcurrent protection and switching sub-circuit comprises an MOS transistor Q5, a fuse F1 and a triode Q6; wherein,
  - a source of the MOS transistor Q5 is connected to a first end of a resistor R83, a first end of a capacitor C135 and a first end of an inductor L19, respectively; a second end of the inductor L19 is connected to a first end of a capacitor C134, the receiving rectifier and regulator circuit, the anode of the diode D10 and the first end of the resistor R76, respectively; a second end of the capacitor C134 is connected to a second end of the capacitor C135, and the second end of the capacitor C134 and the second end of the capacitor C135 are grounded;
  - a gate of the MOS transistor Q5 is connected to a second end of the resistor R83 and a first end of a resistor R87, respectively; a second end of the resistor R87 is connected to a collector of the triode Q6; an emitter of the triode Q6 is grounded, and a base of the triode Q6 is connected to a first end of a resistor R91; a second end of the resistor R91 is connected to the pin P13 of the Bluetooth chip U6;
  - a drain of the MOS transistor Q5 is connected to a first end of the fuse F1, and a second end of the fuse F1 is connected to an anode of the lithium battery BT; a cathode of the lithium battery BT is connected to a grounded resistor RS6 and the charging-current sampling sub-circuit, respectively;
- the charging-voltage sampling sub-circuit comprises a resistor R77, a grounded resistor R81, a resistor R79, a capacitor C123 and a capacitor C124; wherein,
  - a first end of the resistor R77 is connected to the anode of the lithium battery BT; a second end of the resistor R77 is connected to the grounded resistor R81, a first end of the capacitor C124 and a first end of the resistor R79, respectively; a second end of the resistor R79 is connected to a first end of the capacitor C123 and the pin P05 of the Bluetooth chip U6, respectively; a second end of the capacitor C123 is connected to a second end of the capacitor C124, and the second end of the capacitor C123 and the second end of the capacitor C124 are grounded; and
- the charging-current sampling sub-circuit comprises an operational amplifier chip U13; wherein,
  - a power cathode end of the operational amplifier chip U13 is connected to a network CC3; a power supply pin of the operational amplifier chip U13 is connected to the pin AVDD1 of the Bluetooth chip U6 and a first end of a capacitor C158, respectively; a second end of the capacitor C158 is connected to the network CC3;
  - a non-inverting input end of the operational amplifier chip U13 is connected to a first end of a capacitor C155, a first end of a capacitor C156 and a first end of a resistor R92, respectively; a second end of the resistor R92 is connected to a first end of a capacitor C153, a first end of a capacitor C154 and the network CC3, respectively; a second end of the capacitor C153 is connected to a second end of the capacitor C154 and the network CC3, respectively; a second end of the capacitor C155 is connected to a second end of the capacitor C156 and the network CC3, respectively;
  - an inverting input end of the operational amplifier chip U13 is connected to a first end of a resistor R94 and a first end of a resistor R95, respectively; a second end of the resistor R95 is connected to the network CC3; and a second end of the resistor R94 is connected to an output end of the operational amplifier chip U13 and the pin P06 of the Bluetooth chip U6, respectively.

7. The device according to claim 6, wherein the receiving rectifier and regulator circuit comprises a second matching network, a receiving rectifier sub-circuit and a receiving regulator subcircuit;
- the second matching network comprises a capacitor C116, a capacitor C117, a capacitor C125, a capacitor C126; wherein, a first end of the capacitor C116 is connected to a first end of the capacitor C117, a first end of the capacitor C125, a first end of the capacitor C126 and an input end J11 of the magnetic-resonance transmitting antenna, respectively; a second end of the capacitor C116 is connected to a second end of the capacitor C117 and the receiving rectifier sub-circuit; a second end of the capacitor C125 is connected to a second end of the capacitor C126 and the receiving rectifier sub-circuit;

the receiving rectifier sub-circuit comprises a diode D6, a diode D7, a diode D8, a diode D9, a capacitor C118, a capacitor C119 and a capacitor C120; wherein, an anode of the diode D6 is connected to a cathode of the diode D7 and the second end of the capacitor C116, respectively; an anode of the diode D7 is connected to an anode of the diode D9, a first end of the capacitor C118, a first end of the capacitor C119 and a first end of the capacitor C120, respectively, and the anode of the diode D7, the anode of the diode D9, the first end of the capacitor C118, the first end of the capacitor C119 and the first end of the capacitor C120 are grounded; a cathode of the diode D6 is connected to a cathode of the diode D8, a second end of the capacitor C118, a second end of the capacitor C119, a second end of the capacitor C120 and the receiving regulator sub-circuit, respectively; an anode of the diode D8 is connected to a cathode of the diode D9, the second end of the capacitor C125 and an input end J12 of the magnetic-resonance transmitting antenna, respectively; and the receiving regulator sub-circuit comprises a voltage-drop integrated chip U10 and a diode D11; wherein, a pin VIN of the voltage-drop integrated chip U10 is connected to a first end of a resistor R82, a grounded capacitor C132 and the cathode of the diode D6, respectively;

a pin EN of the voltage-drop integrated chip U10 is connected to a grounded resistor R84 and a second end of the resistor R82, respectively;

a pin RT/CLK of the voltage-drop integrated chip U10 is connected to a first end of a resistor R85;

a pin GND of the voltage-drop integrated chip U10 is connected to a pin ePAD of the voltage-drop integrated chip U10 and a second end of the resistor R85, respectively, and the pin GND of the voltage-drop integrated chip U10, the pin ePAD of the voltage-drop integrated chip U10 and the second end of the resistor R85 are grounded;

a pin BOOT of the voltage-drop integrated chip U10 is connected to a first end of a capacitor C127; a second end of the capacitor C127 is connected to a pin SW of the voltage-drop integrated chip U10, a cathode of a diode D11 and a first end of an inductor L20, respectively; a second end of the inductor L20 is connected to a first end of a capacitor C128, a first end of a capacitor C129, a first end of a capacitor C130, a first end of a capacitor C131, a first end of a resistor R86, a first end of a resistor R90, the second end of the inductor L19, the anode of the diode D10 and the first end of the resistor R76, respectively; an anode of the diode D11 is connected to a second end of the capacitor C128, a second end of the capacitor C129, a second end of the capacitor C130 and a second end of the capacitor C131, respectively, and the anode of the diode D11, the second end of the capacitor C128, the second end of the capacitor C129, the second end of the capacitor C130 and the second end of the capacitor C131 are grounded; a second end of the resistor R86 is connected to a first end of a capacitor C136; a second end of the capacitor C136 is connected to a first end of a resistor R89 and a pin FB of the voltage-drop integrated chip U10, respectively; a second end of the resistor R89 is connected to a second end of the resistor R90;

a pin COMP of the voltage-drop integrated chip U10 is connected to a first end of a resistor R88 and a first end of a capacitor C137, respectively; a second end of the resistor R88 is connected to a first end of a capacitor C138; a second end of the capacitor C138 is connected to a second end of the capacitor C137, and the second end of the capacitor C138 and the second end of the capacitor C137 are grounded.

8. A device for controlling wireless charging output power based on a PWM integrating circuit, comprising a magnetic-resonance transmitting module and a magnetic-resonance receiving module connected to the magnetic-resonance transmitting module; wherein, the magnetic-resonance transmitting module comprises a wireless charging base, a Bluetooth master circuit, a DC/DC regulator circuit, a PWM integrating circuit, a radio-frequency power amplifier source, a radio-frequency current sampling circuit and a magnetic-resonance transmitting antenna; wherein, the DC/DC regulator circuit, the PWM integrating circuit, the radio-frequency power amplifier source, the radio-frequency current sampling circuit and the magnetic-resonance transmitting antenna are connected to the Bluetooth master circuit, respectively; the radio-frequency power amplifier source and the magnetic-resonance transmitting antenna are mounted at the wireless charging base; the magnetic-resonance transmitting antenna is connected to the magnetic-resonance receiving module; and the magnetic-resonance receiving module comprises a cooling fin, a magnetic-resonance receiving antenna, a Bluetooth slave circuit, a receiving rectifier and regulator circuit and a charging control circuit wherein, the receiving rectifier and regulator circuit and the charging control circuit are connected to the Bluetooth slave circuit, respectively; the magnetic-resonance receiving antenna, the receiving rectifier and regulator circuit and the charging control circuit are connected successively; the receiving rectifier and regulator circuit and the Bluetooth slave circuit are fixed at an upper surface of the cooling fin; the magnetic-resonance receiving antenna is arranged directly above the magnetic-resonance transmitting antenna;

wherein the magnetic-resonance transmitting antenna and the magnetic-resonance receiving antenna have a flat-plate structure;

a first transmitting resonance coil is arranged at a front side of the magnetic-resonance transmitting antenna, and a second transmitting resonance coil is arranged at a back side of the magnetic-resonance transmitting antenna; each of the first transmitting resonance coil and the second transmitting resonance coil is configured as a first square spiral loop coil with a first gap; the first transmitting resonance coil is provided with a first connection point, and the second transmitting resonance coil is provided with a second connection point;

a through hole is arranged between the first connection point and the second connection point;

a receiving resonance coil is arranged at a front side of the magnetic-resonance receiving antenna, and a first microstrip line and two pads are arranged at a back side of the magnetic-resonance receiving antenna; the receiving resonance coil is configured as a second square spiral loop coil with a second gap, and the receiving resonance coil is provided with a third connection point; the first microstrip line is divided into a first segment microstrip line, a second segment microstrip line and a third second segment microstrip line; the first segment microstrip line and the second segment microstrip line are connected to each other perpendicularly, and the two pads are arranged between the second segment microstrip line and the third segment microstrip line; the microstrip line is connected to the receiving rectifier and regulator circuit through the two pads;

the first segment microstrip line and the second segment microstrip line are provided with a fourth connection point, respectively; a through hole is arranged between the third connection point and the fourth connection point.

9. The device according to claim 8, wherein, geometric and electrical parameters of the magnetic-resonance transmitting antenna are set as follows:

an external length $L_{res\_TX1}$ of the first transmitting resonance coil is 50 mm to 150 mm;

an external width $H_{res\_TX1}$ of the first transmitting resonance coil is 50 mm to 150 mm;

a width $W_{res\_TX1}$ of a second microstrip line in the first transmitting resonance coil is 3 mm to 5 mm;

a distance $S_{res\_TX1}$ between the second microstrip lines in the first transmitting resonance coil is 1 mm to 3 mm;

an external length $L_{res\_TX2}$ of the second transmitting resonance coil is 50 mm to 150 mm;

an external width $H_{res\_TX2}$ of the second transmitting resonance coil is 50 mm to 150 mm;

a width $W_{res\_TX2}$ of a third microstrip line in the second transmitting resonance coil is 3 mm to 5 mm;

a distance $S_{res\_TX2}$ between the third microstrip lines in the second transmitting resonance coil is 1 mm to 3 mm;

a resonant capacitance value of the magnetic-resonance transmitting antenna is 100 pF to 500 pF; and a matching capacitance value of the magnetic-resonance transmitting antenna is 100 pF to 500 pF;

wherein, geometric and electrical parameters of the magnetic-resonance receiving antenna are set as follows:

an external length $L_{res\_RX}$ of the receiving resonance coil is 30 mm to 50 mm;

an external width $H_{res\_RX}$ of the receiving resonance coil is 30 mm to 50 mm;

a width $W_{res\_RX}$ of a fourth microstrip line in the receiving resonance coil is 0.5 mm to 1.5 mm;

a distance $S_{res\_Rx}$ between the fourth microstrip lines in the receiving resonance coil is 0.3 mm to 0.7 mm;

a length $L_{res\_RX1}$ of the first segment microstrip line is 3 mm to 5 mm;

a width $W_{res\_RX1}$ of the first segment microstrip line is 0.5 mm to 1.5 mm;

a length $L_{res\_RX2}$ of the second segment microstrip line is 5 mm to 7 mm;

a width $W_{res\_RX2}$ of the second segment microstrip line is 0.5 mm to 1.5 mm;

a length $L_{res\_RX3}$ of the third segment microstrip line is 5 mm to 7 mm;

a width $W_{res\_RX3}$ of the third segment microstrip line is 0.5 mm to 1.5 mm;

a length $L_{pad\_RX}$ of the pad is 3 mm to 5 mm;

a width $W_{pad\_RX}$ of the pad is 1 mm to 3 mm;

a resonant capacitance value of the magnetic-resonance receiving antenna is 100 pF to 500 pF; and a matching capacitance value of the magnetic-resonance receiving antenna is 100 pF to 500 pF.

\* \* \* \* \*